United States Patent
Tomisato

(10) Patent No.: US 7,956,652 B2
(45) Date of Patent: Jun. 7, 2011

(54) SEMICONDUCTOR INTEGRATED CIRCUIT

(75) Inventor: Shigeki Tomisato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 133 days.

(21) Appl. No.: 12/382,347

(22) Filed: Mar. 13, 2009

(65) Prior Publication Data

US 2009/0237119 A1   Sep. 24, 2009

(30) Foreign Application Priority Data

Mar. 24, 2008  (JP) ................. 2008-075423

(51) Int. Cl.
*H03K 5/22* (2006.01)
*H03K 5/153* (2006.01)
(52) U.S. Cl. ............... 327/82; 327/91; 327/93; 327/94
(58) Field of Classification Search .......... 327/82, 327/91, 93, 94
See application file for complete search history.

(56) References Cited

U.S. PATENT DOCUMENTS 5,481,212 A * 1/1996 Shima .................... 327/94

FOREIGN PATENT DOCUMENTS

JP   02-034490      2/1990
JP   2002-237743 A  8/2002

* cited by examiner

*Primary Examiner* — Lincoln Donovan
*Assistant Examiner* — John W Poos
(74) *Attorney, Agent, or Firm* — Foley & Lardner LLP

(57) ABSTRACT

A semiconductor integrated circuit has a sampling circuit which samples a potential of an input terminal, a dynamic comparator having a standby and a comparison mode which compares the potential of the input terminal and a reference potential, a switch for input signals connected between the input terminal and the dynamic comparator, a capacitor for comparator having one end connected between the switch for input signals and the dynamic comparator and another end connected to a fixed potential, and a timing control circuit which controls a timing to sample by sampling circuit, a timing to switch modes of dynamic comparator, and a timing to make switch for input signals conducting or blocking state. The timing control circuit makes the switch for input signals blocking state from conducting state before the dynamic comparator switches from standby mode to comparison mode, and terminates sampling by sampling circuit after switching modes.

12 Claims, 17 Drawing Sheets

US 7,956,652 B2

SEMICONDUCTOR INTEGRATED CIRCUIT

BACKGROUND

1. Field of the Invention

The present invention relates to a semiconductor integrated circuit, and particularly to a semiconductor integrated circuit having a comparator and a sampling circuit.

2. Description of Related Art

In recent years, as the speed of electric signals increases and circuit size of an entire semiconductor device used in electric equipments becomes larger, it is desired to miniaturize and reduce power consumption of semiconductor devices. In connection with this, it is becoming important to miniaturize and reduce power consumption of a comparator, which is one of basic circuit configuration of a semiconductor device. The comparator here is a device for an Analog-to-Digital (A/D) conversion which compares two input voltages and outputs the size relation thereof as a digital value.

Although the dynamic comparator circuit disclosed in Japanese Patent Publication No. 02-34490 has an advantage as compared to a comparator circuit of a related art that it is highly sensitive to an input voltage difference with its comparatively small circuit size and the power consumption in the standby and operating time is low. Therefore, dynamic comparators are becoming to be widely used in recent years.

FIG. 1 is a circuit diagram of a dynamic comparator 70 disclosed in Japanese Patent Publication No. 02-34490. The configuration and the operation of the dynamic comparator 70 are explained with reference to FIG. 1.

In FIG. 1, the dynamic comparator 70 includes a first flip-flop which is composed of a pair of cross-coupled N type transistors MN2 and MN3 and initial stage input signal transistors 71 and 72 which have common sources and drains with the N type transistors MN2 and MN3 that make up the first flip-flop.

The dynamic comparator further includes a second flip-flop which is of opposite polarity to the first flip-flop and is composed of a pair of cross-coupled P type transistors MP1 and MP2. Further, the dynamic comparator includes P type transistors MP0 and MP3 which have common sources and drains with the P type transistors MP1 and MP2 that make up the second flip-flop.

Furthermore, drains and sources of N type transistors MN6 and MN7 are respectively connected between the drains of the P type transistors MP1 and MP2 and drains of the N type transistors MN2 and MN3. Gates of the P type transistors MP0 and MP3, and N type transistors MN6 and MN7 are connected to a mode switching terminal 4. A pulse signal is input to the mode switching terminal. Gates of the initial stage input signal transistors 71 and 72 are respectively connected to an input signal input terminal 8 and a reference potential input terminal 9. Voltages to be compared are externally input to the input terminals.

Moreover, the drains of the N type transistors MN6 and MN7 are respectively connected to output nodes CMPB and CMP. Furthermore, sources of the N type transistors MN2 and MN3, the initial stage input signal transistors 71 and 72, and N type transistors MN8 and MN9 are connected to a low potential power supply Vss. On the other hand, the P type transistors MP0, MP1, MP2, MP3, MP4 and MP5 are connected to a high potential power supply Vdd.

Next, the operation of the dynamic comparator 70 is explained with reference to FIG. 1. There are two operation modes for the dynamic comparator 70, which are a standby mode and a comparison mode.

When the mode switching terminal 4 is at Low level, the dynamic comparator 70 goes into the standby mode. In the standby mode, the output nodes CMPB and CMP are reset to High level. When the dynamic comparator 70 goes into the comparison mode, preparations for injecting a current into the first flip-flop, which is composed of the N type transistors MN2 and MN3, is performed.

When the mode switching terminal 4 is changed to High level, the dynamic comparator 70 goes into the comparison mode. In the comparison mode, the dynamic comparator 70 compares a potential difference of the input signal input terminal 8 and the reference potential input terminal 9. Then the dynamic comparator 70 outputs the result to the output node CMP by logic signal voltage. Detailed operation is explained with reference to FIG. 1.

A transition of the mode switching terminal 4 from Low level to High level causes the P type transistors MP0 and MP3 to be non-conducting state, and the N type transistors MN6 and MN7 to be conducting state. A current flows into input nodes CN1 and CN2 via the N type transistors MN6 and MN7, and the potentials of the input nodes CN1 and CN2 begin to increase. If the potential of the input signal input terminal 8 is higher than that of the reference potential input terminal 9, the potential of the input node CN2 exceeds a threshold voltage of the N type transistor MN2 before the potential of the input node CN1. This is because that the current flowing into the initial step input signal transistor 72 is smaller than the current flowing into the initial stage input signal transistor 71. As a result, a current begins to flow also into the N type transistor MN2, and the potential of the input node CN1 will not increase. On the other hand, the potential of the input node CN2 continues to increase, and the potential difference of the input nodes CN1 and CN2 increases rapidly.

This potential difference is transmitted to the second flip-flop, which is composed of the P type transistors MP1 and MP2. Then, similarly, the potential difference of the output nodes CMPB and CMP increases rapidly.

That is, the dynamic comparator 70 realizes functionalities which are highly sensitive to an input potential difference and is capable of high-speed output response to an input signal by the increased potential difference between the input nodes CN1 and CN2 using the double flip-flops.

It is noted that the comparator disclosed by Japanese Unexamined Patent Application Publication No. 2002-237743 is one of application circuits using this kind of comparator.

SUMMARY

Using the characteristic of the high-speed output response to an input signal of the dynamic comparator 70, the dynamic comparator 70 can be used for inputs in discrete-time processes of an Analog-to-Digital converter (ADC) etc.

FIG. 2 illustrates an example of a circuit using the dynamic comparator 70 for input of a signal processing circuit 90 such as an ADC. In this example, the dynamic comparator 70 is used to determine whether an input signal potential of an analog input signal source 60 exceeds an upper limit of an input signal level of the signal processing circuit 90 before a signal is input to the signal processing circuit 90.

The operation of the circuit in FIG. 2 is explained with reference to the timing chart of FIG. 3. First, a sampling time control switch 22 is made conductive. Then an input signal potential is sampled to a sampling input potential holder 24 of a sampling circuit 20 (at the point of 102). After the input potential holder 24 is charged, the sampling time control switch 22 is blocked. Next, the mode switching terminal 4 is changed to the High level and the dynamic comparator 70 is switched from the standby mode to the comparison mode (at the point of 104). This enables to compare the input signal potential and a reference potential 3, which is a maximum potential of the input signal level of the signal processing circuit 90. The comparison result is transmitted from an output terminal 5 to the signal processing circuit 90 via a signal line. The signal processing circuit 90 performs a signal processing operation to an output potential of the sampling circuit 20 if the input signal potential is equal to or less than the reference potential 3.

It is important to switch the mode switching terminal 4 after the sampling time control switch 22 is made nonconductive. This is to prevent the sampling potential from fluctuating caused by kickback noise which is generated in input terminals (8 and 9) of the dynamic comparator 70 when switching mode by the mode switching terminal 4.

The mechanism of generating kickback noise is explained hereinafter. In FIG. 1, when switching the mode switching terminal 4 from the Low level to the High level in order to switch the dynamic comparator 70 from the standby mode to the comparison mode, the N type transistor MN6 changes from the non-conducting state to the conducting state. At this time, a potential of the gate of the N type transistor MN6 rapidly changes and a current rapidly flows into the input node CN1. As a result, the potential of the input node CN1 fluctuates in an instant, and the potential fluctuation is rapidly amplified by the double flip-flop. This potential fluctuation will flow into the input signal input terminal 8 from the input node CN1 as kickback noise by a drain-gate capacitance including parasitic capacitance of the initial stage input signal transistor 71.

Therefore, the present inventor has found a problem that in order to avoid kickback noise from the dynamic comparator 70 in a circuit as shown in FIG. 2, the time to terminate sampling of the sampling circuit 20 is limited to before switching the dynamic comparator 70 from the standby mode to the comparison mode.

In recent years, along with higher speed of clock signals, it has come to be difficult to ensure enough sampling time in a discrete-time processing circuit as the one shown in FIG. 2. In other words, with higher speed, the mode switching timing of the dynamic comparator 70 (the point 106 to 104 in FIG. 3 (standby mode)) becomes shorter and so does the sampling time. Insufficient sampling disables the sampling circuit 20 to hold an input signal potential and thereby generating an operation failure.

Therefore, a circuit is desired in which a mode switch of the dynamic comparator 70 does not cause the sampling potential to fluctuate even if sampling is terminated after switching the mode of the dynamic comparator 70 in order to ensure sufficient sampling time.

An exemplary aspect of an embodiment of the present invention is a semiconductor integrated circuit that includes an input signal source connected to an input terminal of a sampling circuit and an input terminal of a dynamic comparator, and a switch connected between the input signal source and the input terminal of the dynamic comparator. Further, the semiconductor integrated circuit includes a capacitor having one end connected between the switch and the input terminal of the dynamic comparator, and another end connected to a fixed potential. The comparator circuit makes the switch enter a blocking state from a conducting state before the dynamic comparator switches from a standby mode to a comparison mode and terminates a sampling after the dynamic comparator switches from the standby mode to the comparison mode.

According to the present invention, a mode switch of the dynamic comparator does not influence the sampling potential of the sampling circuit. Thus the sampling can be terminated after switching the mode of the dynamic comparator.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
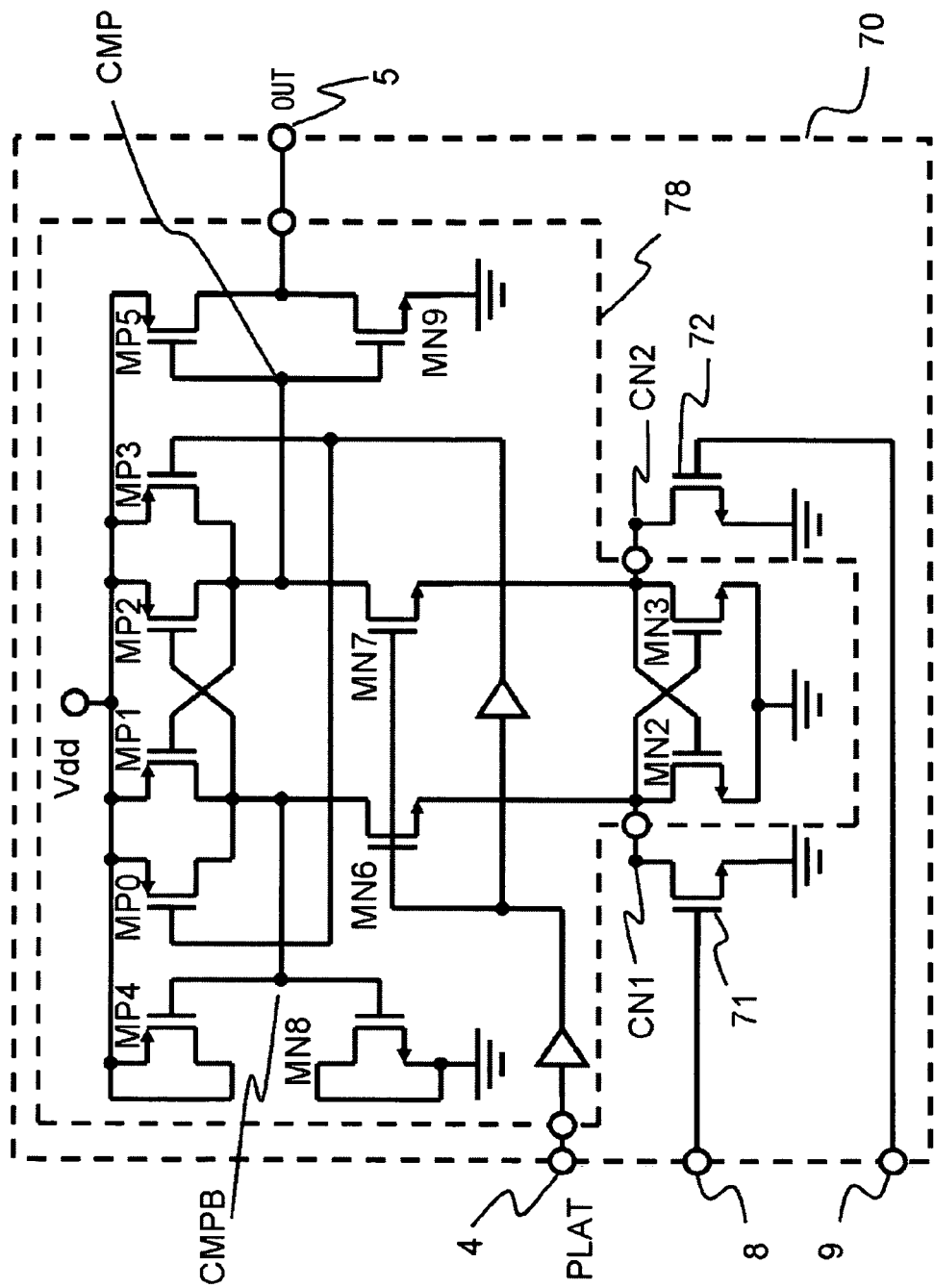
FIG. 1 is a circuit diagram illustrating the configuration of a dynamic comparator circuit.
Figure 2:
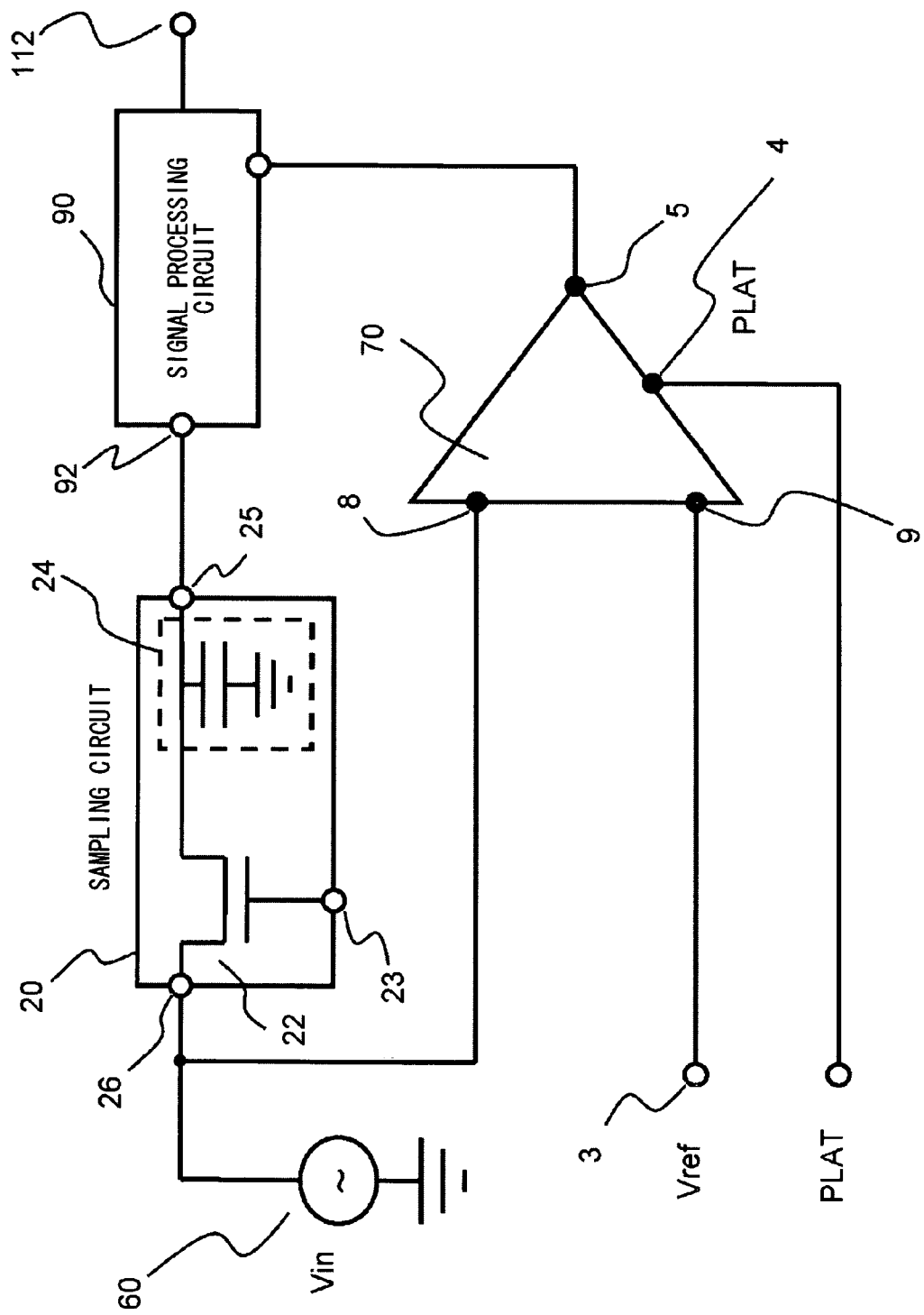
FIG. 2 is a circuit diagram explaining the problem.
Figure 3:
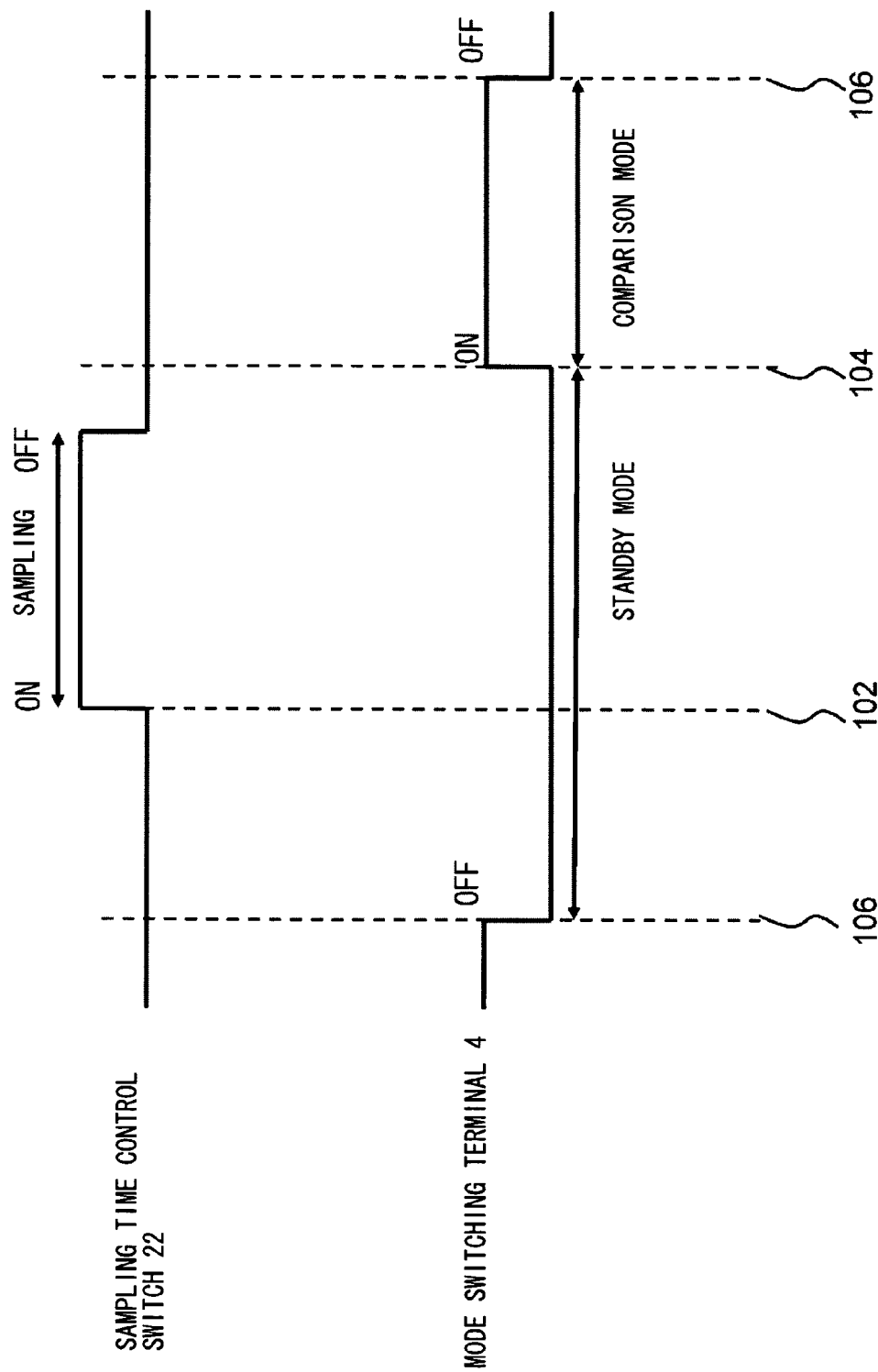
FIG. 3 is a timing chart explaining the problem.
Figure 4:
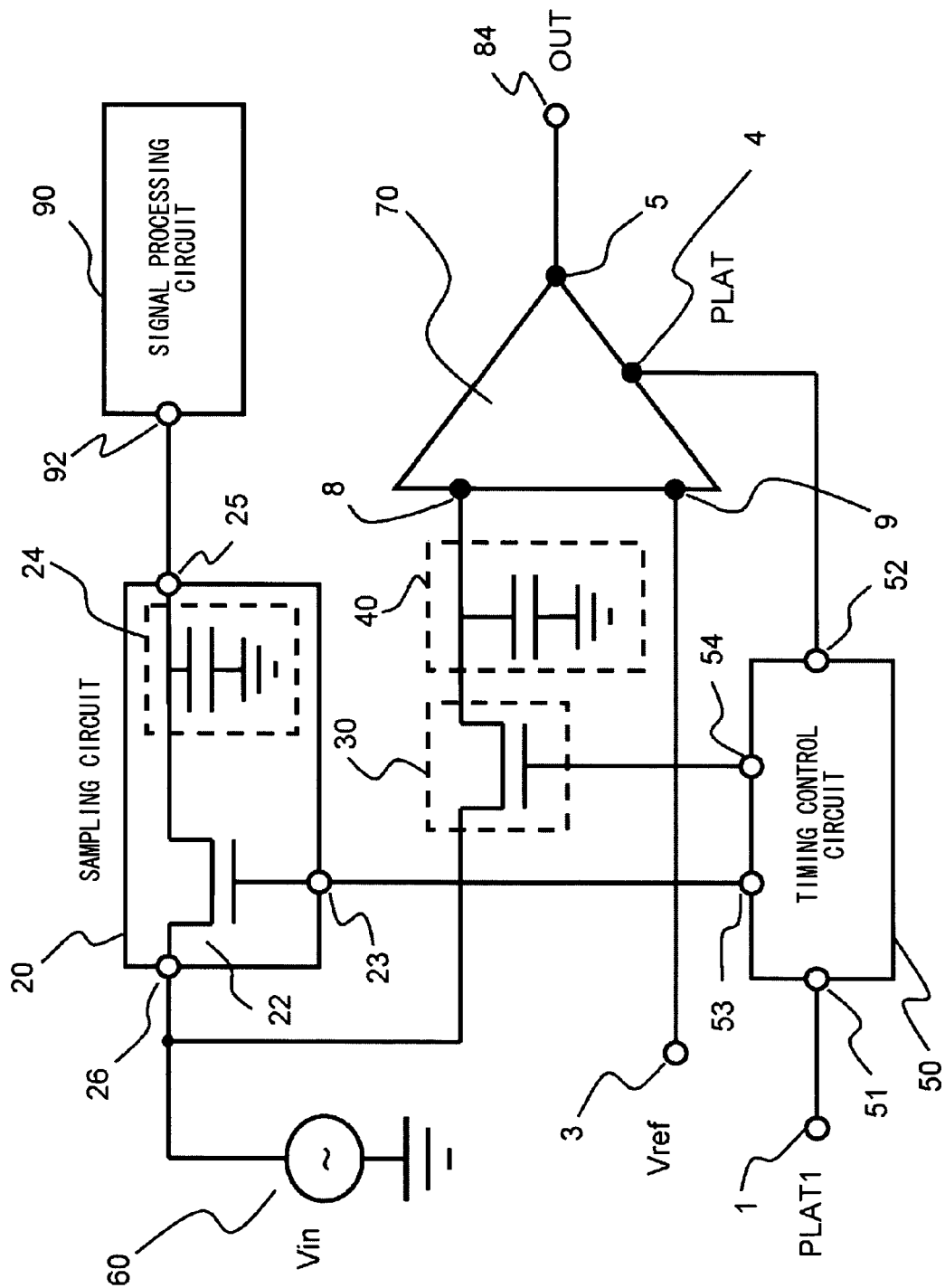
FIG. 4 is a circuit diagram illustrating the configuration of a semiconductor integrated circuit according to an exemplary embodiment of the present invention.
Figure 12:
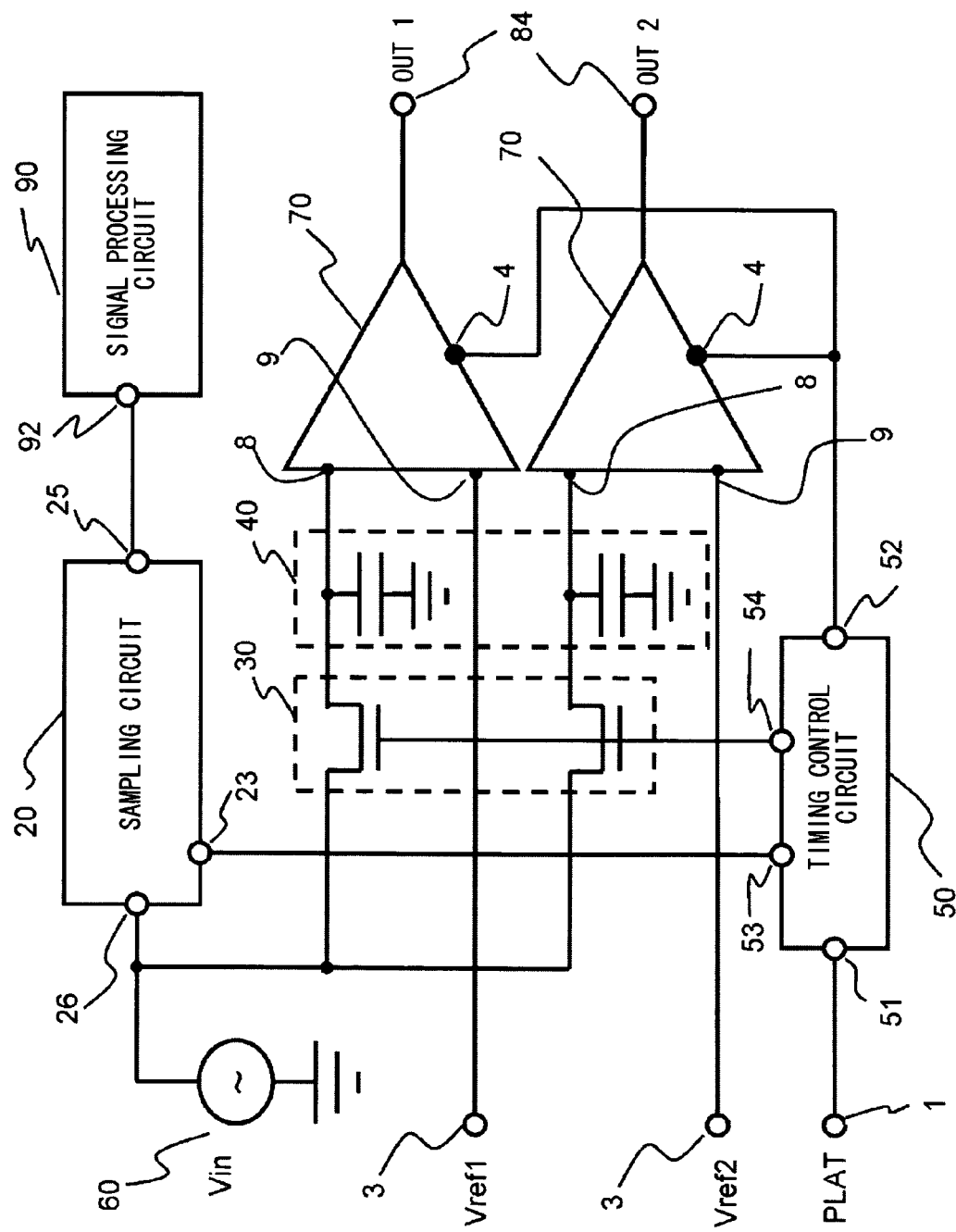
FIG. 12 is a circuit diagram illustrating the configuration of a semiconductor integrated circuit according to a sixth exemplary embodiment of the present invention.
Figure 13:
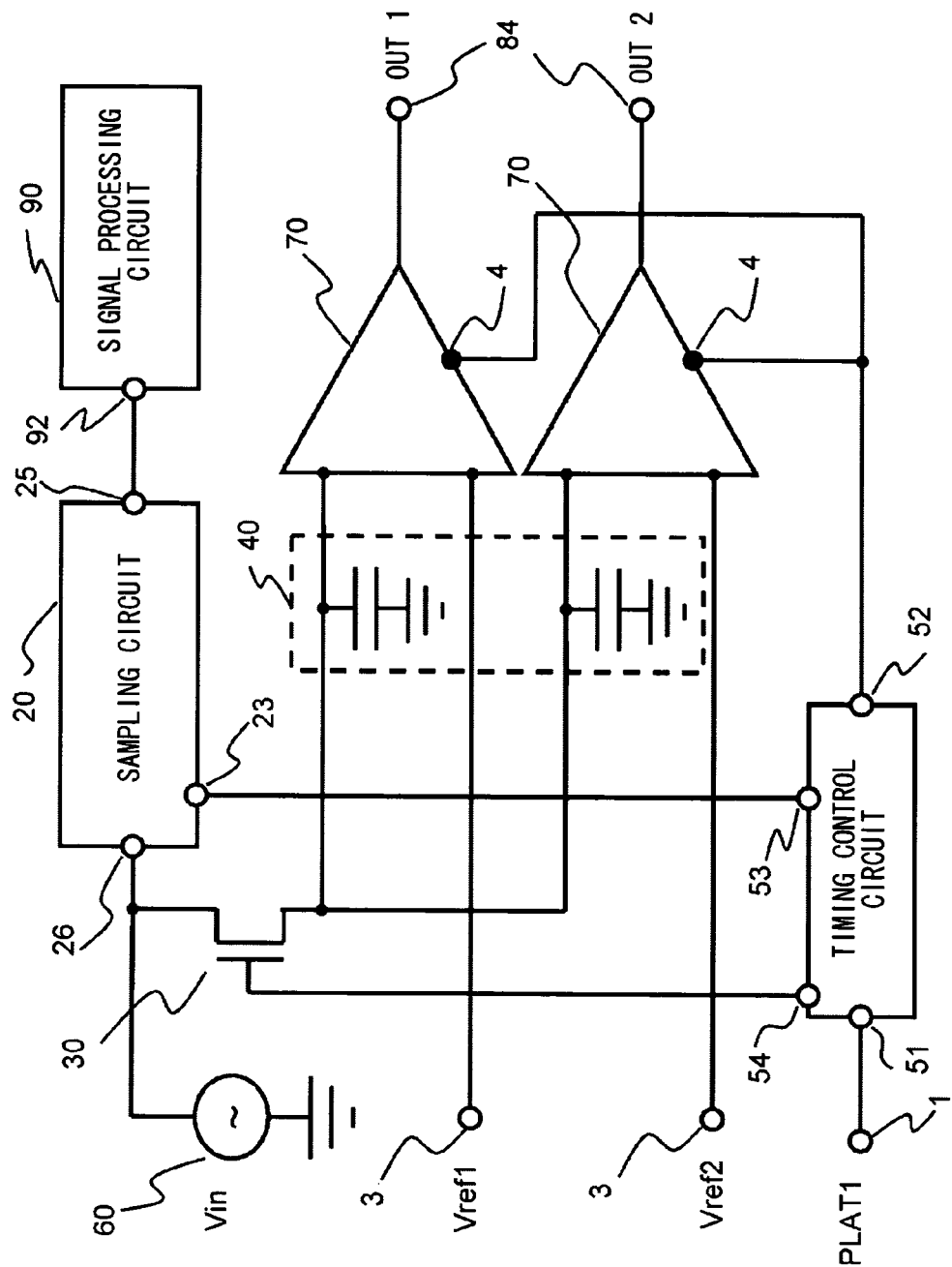
FIG. 13 is a circuit diagram illustrating the configuration of a semiconductor integrated circuit according to a seventh exemplary embodiment of the present invention.

A first exemplary embodiment of the present invention is described with reference to FIGS. 4 and 5. The configuration of the first exemplary embodiment is explained with reference to FIG. 4. It is noted that dynamic comparators 70 of FIGS. 4, 12 and 13 are the same as the dynamic comparator 70 shown in FIG. 1. Moreover, internal circuits 78 shown in FIGS. 6, 14, 15 and 17 are the same as an internal circuit 78 of the dynamic comparator of FIG. 1.

The input signal input terminal 8 and the input signal source 60 of the dynamic comparator 70 are connected via a switch for input signals 30. If kickback noise is generated from the dynamic comparator 70, the switch for input signals 30 is used to block the circuit so that the kickback noise may not flow into the input signal source 60 side. One end of a capacitor for comparator 40 is connected between the switch for input signals 30 and the input signal input terminal 8. The other end of the capacitor for comparator 40 is connected to a fixed potential. The capacitor for comparator 40 is provided to maintain the potential of the input signal input terminal 8 when the switch for input signals 30 is in a blocking state.

The input signal source 60 is connected also to a sampling potential input terminal 26 of the sampling circuit 20. A sampling circuit potential output terminal 25 of the sampling circuit 20 is connected to the signal processing circuit 90 for outputting a sampled input potential to the signal processing circuit 90. The sampling circuit 20 temporarily holds the potential input from the sampling potential input terminal 26 and outputs the potential to the signal processing circuit 90.

The sampling circuit 20 is composed of a sampling time control switch 22 and a sampling input potential holder 24. The sampling time control switch 22 and the sampling input potential holder 24 are connected in series. While the sampling time control switch 22 is conductive, an input potential from the sampling potential input terminal 26 is charged to the sampling input potential holder 24. The sampling input potential holder 24 includes a capacitor. An easiest configuration example of the sampling input potential holder 24 is a capacitor having one end connected to a signal line and the other end connected to a fixed potential. The capacitance of the capacitor of the sampling input potential holder 24 is larger than that of the capacitor for comparator 40. This is because that in general, signal processing time by the signal processing circuit 90 using an input signal potential is longer than the time required for comparison by the dynamic comparator 70 using an input signal potential. Therefore, the sampling time of the sampling circuit 20 is longer than the charging time of the capacitor for comparator 40.

Figure 19:
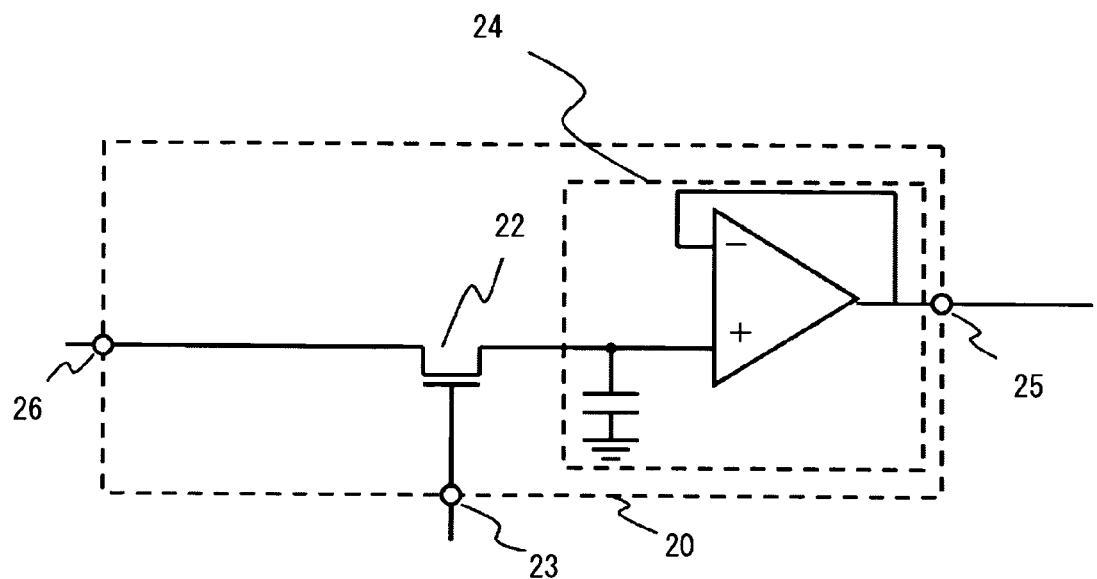
FIG. 19 is a circuit diagram illustrating an example of a sampling circuit 20.

In a case that the sampling input potential holder 24 is composed only of a capacitor, if an input impedance of the signal processing circuit 90 is low, there is a possibility that the potential of the sampling input potential holder 24 may fall during the process of the signal processing circuit 90. In such case, it is better to use the sampling circuit 20 shown in FIG. 19. In the circuit of FIG. 19, the sampling input potential holder 24 includes a differential input circuit disposed between the sampling circuit potential output terminal 25 and the capacitor. Therefore, an electric charge of the capacitor will not directly flow into the signal processing circuit 90 and thereby preventing from reducing the sampling potential.

The signal processing circuit 90 uses the input signal potential of the dynamic comparator 70 as an input signal after the comparison by the dynamic comparator 70. An example of an application of the signal processing circuit 90 is a successive approximation ADC, such as a pipeline ADC. For example, the dynamic comparator 70 can be used to determine in advance whether the input signal potential is less than or equal to the upper limit of the input signal level of the signal processing circuit 90.

Figure 20:
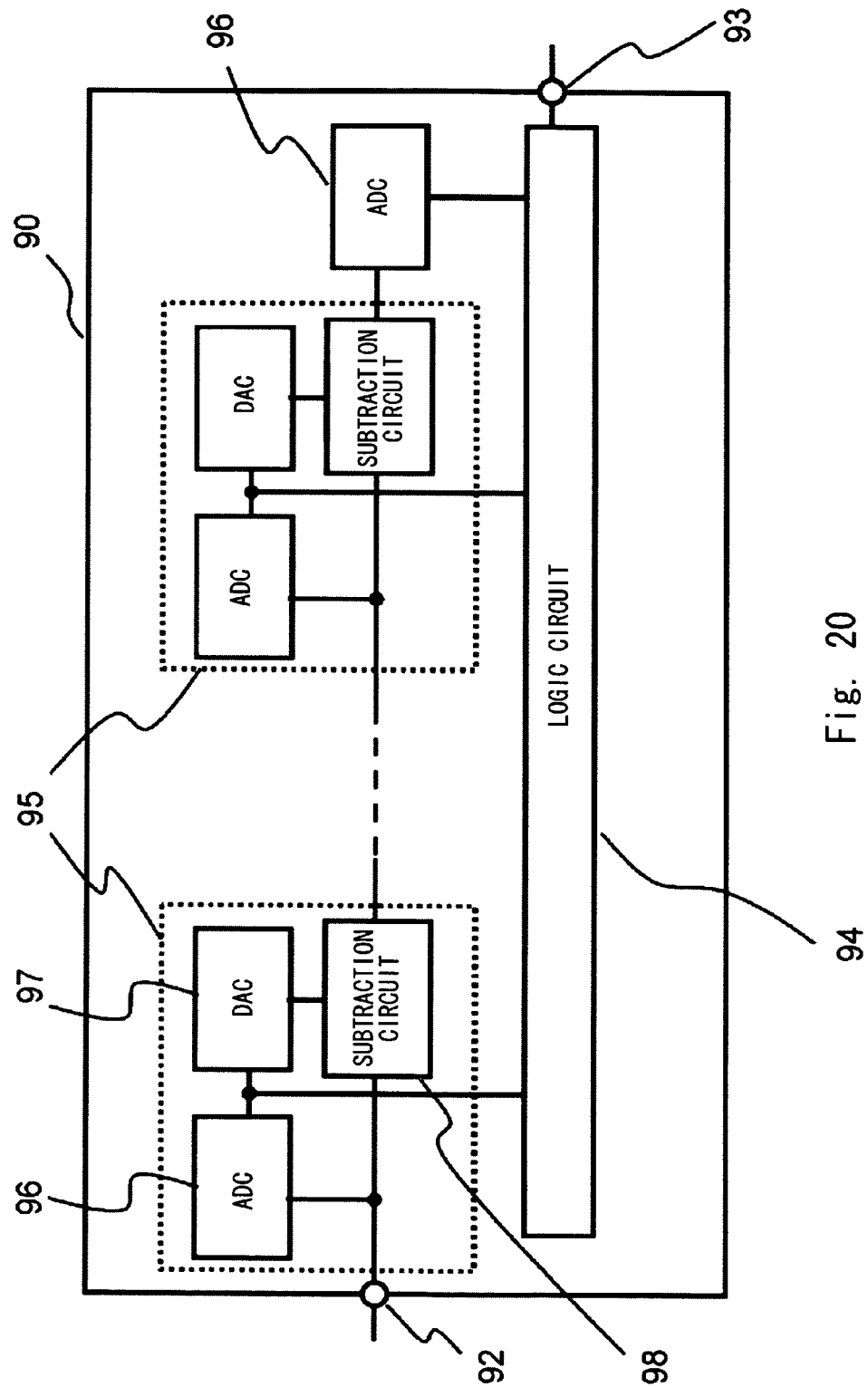
FIG. 20 is a pipeline ADC circuit illustrating an example of a signal processing circuit 90.

An example of a pipeline ADC circuit is shown in FIG. 20. The pipeline ADC is composed of a plurality of ADC sections 95, a logic circuit 94 and an ADC 96. In the ADC section 95, the ADC 96 outputs an input signal potential as a digital output value and then a Digital-to-Analog converter (DAC) 97 converts the digital output value again into an analog converted potential. A subtraction circuit 98 subtracts the analog converted potential from the signal potential and outputs a fixed multiple of the potential. This output is provided to the subsequent ADC section 95 as an input potential, and the same process is carried out. The processes are carried out sequentially by the ADC sections 95 for the number of ADC sections 95. The logic circuit 94 generates digital data from the digital output value of each ADC section 95 according to the rule and outputs it to the ADC output terminal 93 as a digital signal. When performing A/D and D/A conversions by the plurality of ADC sections 95 sequentially to the signal potentials which are input from the signal input terminal 92, the input potentials may be fluctuated during the conversions. This causes to generate a conversion error in the data output to the ADC output terminal 93. The sampling circuit 20 is provided before the signal processing circuit 90 to avoid the abovementioned issue.

The reference potential input terminal 9 of the dynamic comparator 70 is connected to the reference potential 3 for comparing the reference potential 3 and the potential of the input signal input terminal 8 and outputting the comparison result to the output terminal 5. The mode switching terminal 4 of the dynamic comparator 70 is a control terminal for switching the dynamic comparator 70 to the standby mode and the comparison mode.

In the timing control circuit, a sampling time control signal output terminal 53 is connected to a sampling time control signal input terminal 23 of the sampling circuit, a switch for input signals control signal output terminal 54 is connected to the switch for input signals 30, and a dynamic comparator control signal output terminal 52 is connected to the mode switching terminal 4 of the dynamic comparator 70. The timing control circuit 50 outputs a control signal which turns off the switch for input signals 30 from the switch for input signals control signal output terminal 54 to the control signal input 1. After that, the timing control circuit 50 outputs a control signal which switches the dynamic comparator from the standby mode to the comparison mode from the dynamic comparator control signal output terminal 52. After a predetermined time, the timing control circuit 50 outputs a control signal which terminates the sampling of the sampling circuit 20 from the sampling time control signal output terminal 53.

Next, the operation of the first exemplary embodiment is explained with reference to the timing chart shown in FIG. 5. First, the sampling time control switch 22 is made conductive and then the sampling circuit 20 starts sampling a potential of the input signal source 60. Moreover, the switch for input signals 30 is made conductive and then the potential of the input signal source 60 is charged to the capacitor for comparator 40. This corresponds to the time 102 of FIG. 5. At this time, the dynamic comparator 70 is set to the standby mode.

In order for the dynamic comparator 70 to compare the potential of the input signal source 60 and the reference potential 3, the switch for input signals 30 is first made into a blocking state. This corresponds to the time 103 of FIG. 5. Next, the mode switching terminal 4 is changed to High level to transit the dynamic comparator 70 from the standby mode to the comparison mode. This corresponds to the time 104 of FIG. 5. The switch for input signals 30 is in a blocking state at the start time of the comparison mode. However the potential of the input signal input terminal 8 is maintained to the potential of the input signal source 60 by the capacitor for comparator 40. The dynamic comparator 70 starts comparing the potential of the input signal input terminal 8 and the reference potential 3.

After starting the comparison mode, when sufficient time for sampling has passed, the sampling time control switch 22 enters a blocking state to terminate the sampling. This corresponds to the time 105 of FIG. 5. All of the above timing control is performed by the timing control circuit 50.

As described above, the exemplary embodiment of the present invention has the switch for input signals 30 which prevents kickback noise at the start time of the comparison mode (at the time 104) from flowing into the sampling circuit 20. This eliminates the need to terminate the sampling before starting the comparison mode. That is, since the sampling can be terminated after starting the comparison mode, it is possible to ensure necessary and sufficient time for sampling.

Accordingly, even if a system including the dynamic comparator increases its speed and the time from the start of sampling to the start time of the comparison mode is shortened, it is not necessary to reduce the time from the sampling start to the sampling termination. Thus the exemplary embodiment of the present invention provides a circuit which is especially advantageous in high speed operations.

Second Exemplary Embodiment

Figure 6:
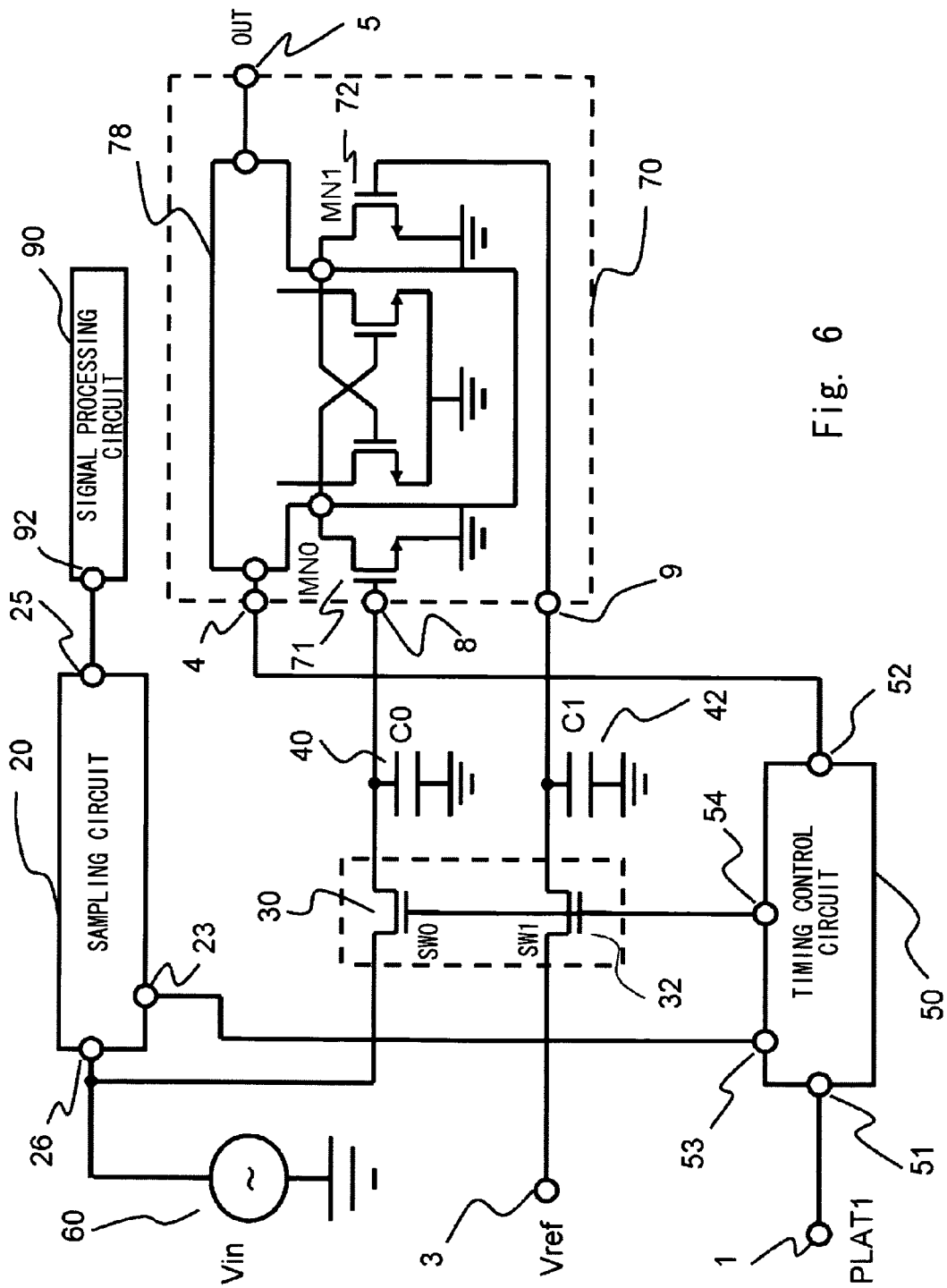
FIG. 6 is a circuit diagram illustrating the configuration of a semiconductor integrated circuit according to a second exemplary embodiment of the present invention.

FIG. 6 illustrates a circuit according to a second exemplary embodiment of the present invention. FIG. 6 illustrates only initial stage input signal transistors 71 and 72 of the dynamic comparator 70. The dynamic comparator latch circuit section 78 represents the internal circuit of the dynamic comparator circuit other than the initial stage input signal transistors. The difference of the second exemplary embodiment from the first exemplary embodiment is that a switch for reference potential 32 and a capacitor for comparator reference potential 42 are connected between the reference potential 3 and the reference potential input terminal 9. Along with the switch for input signals 30, the switch for reference potential 32 is controlled by an output signal from the switch for input signals control signal output terminal 54 of the timing control circuit 50. The capacitor for comparator reference potential 42 is connected in order to provide the reference potential 3 to the reference potential input terminal 9 even when the switch for reference potential 32 is in a blocking state.

In the second exemplary embodiment, the switch for reference potential 32 is connected also to the reference potential 3, thus the following new effect can be achieved. The first new effect is to suppress kickback noise generated when switching from the standby mode to the comparison mode from flowing into the reference potential 3.

The second new effect is to reduce the influence of switching noise generated from the switch for input signals 30 on the output result of the dynamic comparator. In the second exemplary embodiment, the switches (30 and 32) and capacitors (40 and 42) are connected to both of the input signal and the reference potential 3 sides and thereby creating a symmetrical circuit configuration. Therefore, the influence of switching noise generated when the switches (30 and 32) transit to a conducting or blocking state becomes equivalent in the input signal and reference potential sides. As a result, the influence of switching noise on the comparison result of the dynamic comparator 70 can be reduced.

Third Exemplary Embodiment

Figure 7:
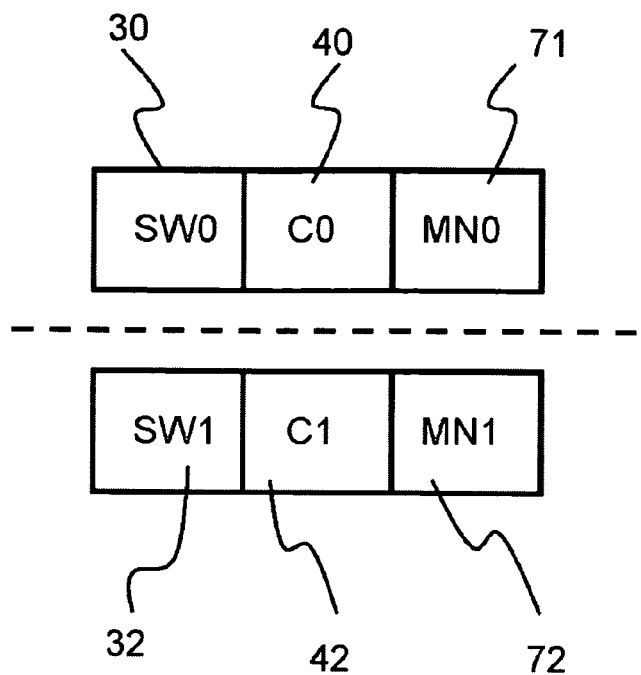
FIG. 7 is a layout diagram illustrating the configuration of a semiconductor integrated circuit according to a third exemplary embodiment of the present invention.

The layout of a third exemplary embodiment is shown in FIG. 7. FIG. 7 illustrates a layout diagram of a circuit according to the second exemplary embodiment which is disposed over a chip when viewed from above. In the circuit configuration of the second exemplary embodiment, the switch for input signals 30, the capacitor for comparator 40, and the first initial stage input signal transistor 71 are arranged axisymmetrically with the switch for reference potential 32, the capacitor for comparator reference potential 42 and the second initial stage input signal transistor 72, respectively. In FIG. 7, the switch for input signals 30, the capacitor for comparator 40, and the first initial stage input signal transistor 71 are arranged in order. However the order of the arrangement may be different.

In the third exemplary embodiment, for the circuit of the second exemplary embodiment, the switches (30 and 32), the capacitors (40 and 42), and the initial stage input signal transistors (71 and 72) in the input signal 60 and the reference potential 3 sides are arranged axisymmetrically. Thus the influence of variations, such as threshold voltage and oxide film thickness, becomes the same, and the influence by the random offset resulting from the variations can be reduced. As a result, a comparator which is strong against the characteristic variation in manufacturing process is obtained as a new effect.

Fourth Exemplary Embodiment

Figure 8:
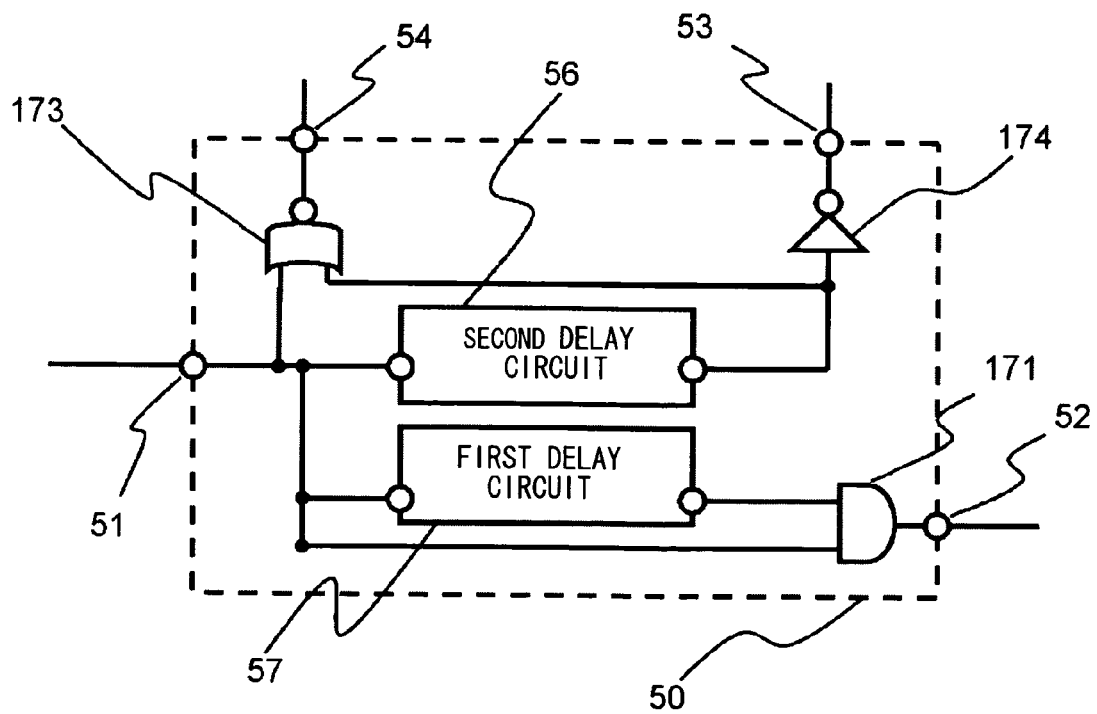
FIG. 8 is a circuit diagram illustrating the configuration of a timing control circuit of a semiconductor integrated circuit according to a fourth exemplary embodiment of the present invention.

A fourth exemplary embodiment is shown in FIG. 8. The timing control circuit 50 is composed of a second delay circuit 56, a first delay circuit 57, an AND circuit 171, a NOR circuit 173 and an inverter circuit 174. The switch for input signals control signal output terminal 54 is connected to an output of the NOR circuit 173. Outputs of the timing control signal input terminal 51 and the second delay circuit 56 are connected to an input of the NOR circuit 173. The sampling time control signal output terminal 53 is connected to an output of the second delay circuit 56 via the inverter circuit 174. Moreover, the dynamic comparator control signal output terminal 52 is connected to the output of the AND circuit 171. The outputs of the timing control signal input terminal 51 and the first delay circuit 57 are connected to the input of the AND circuit 171.

Next, the operation of the timing control circuit 50 is explained with reference to FIGS. 5 and 8. The explanation starts from the point of 106 in FIG. 5. At this time, the sampling time control signal output terminal 53 and the switch for input signals control signal output terminal 54 are at Low level. If the timing control signal input terminal 51 switches from High level to Low level, the output of the AND circuit 171 is set to Low level and the dynamic comparator control signal output terminal 52 switches from High level to Low level. Moreover, since the inputs of the second delay circuit 56 and the first delay circuit 57 switch from High level to Low level, the outputs of those circuits switch from High level to Low level after a predetermined time.

When the output of the second delay circuit 56 switches from High level to Low level, both two inputs of the NOR circuit 173 switch to Low level. Thus the switch for input signals control signal output terminal 54 is set to High level. Furthermore, the output of the second delay circuit 56 switches to Low level, thus the sampling time control signal output terminal 53 also switches to High level. This corresponds to the time 102 of FIG. 5. It is noted that at this time, the operation of the first delay circuit 57 does not concern the control of these output terminals 52, 53 and 54.

Next, the operation when switching the timing control signal input terminal 51 from Low level to High level is explained. This corresponds to the time 103 of FIG. 5. When the timing control signal input terminal 51 switches to High level, one of the inputs of the NOR circuit 173 switches to High level. Thus the switch for input signals control signal output terminal 54 switches to Low level.

After a respective predetermined time, the outputs of the second delay circuit 56 and the first delay circuit 57 switch from Low level to High level. The delay time of the second delay circuit 56 is set to be longer than that of the first delay circuit 57. Since both inputs of the AND circuit 171 switch to High level if the output of the first delay circuit switches to High level, the dynamic comparator control signal output terminal 52 switches to High level. This corresponds to the time 104 of FIG. 5.

Next, if the output of the second delay circuit 56 switches to High level, the sampling time control signal output terminal 53 switches to Low level. This corresponds to the time 105 of FIG. 5.

Figure 5:
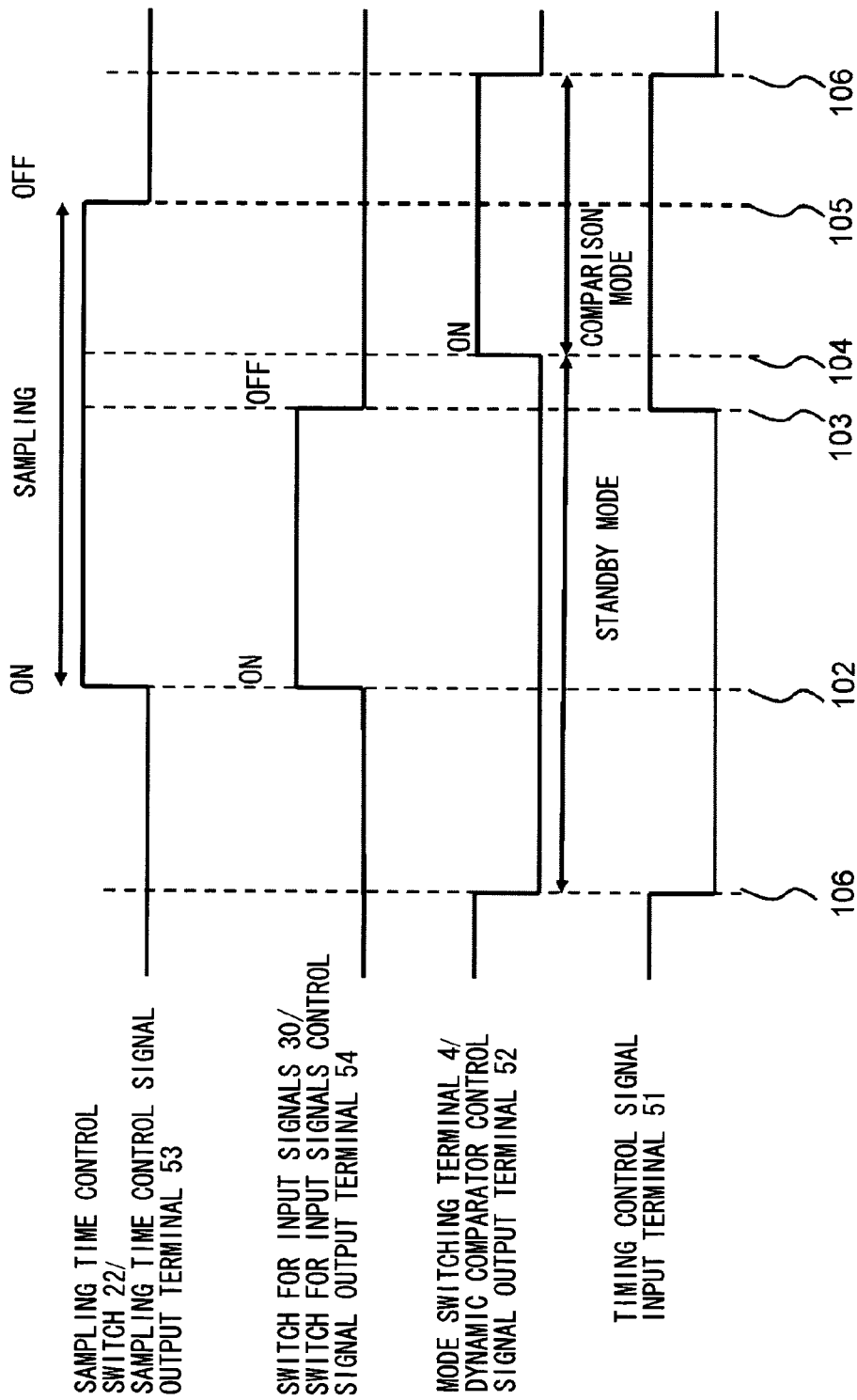
FIG. 5 is a timing chart illustrating an operation of the semiconductor integrated circuit according to an exemplary embodiment of the present invention.

Thus, the timing control circuit 50 shown in FIG. 8 can automatically control the comparator circuit according to the timing chart shown in FIG. 5.

Figure 9:
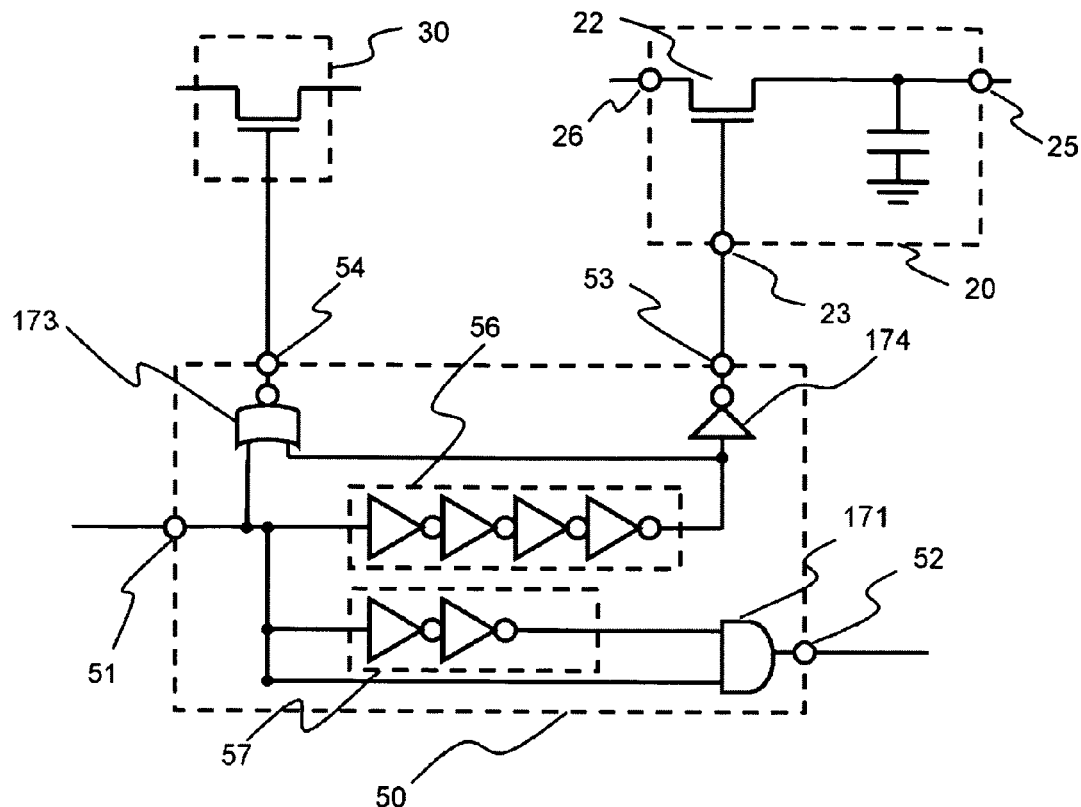
FIG. 9 is a circuit diagram illustrating a part of the configuration of the semiconductor integrated circuit according to the fourth exemplary embodiment of the present invention.

FIG. 9 illustrates a fourth exemplary embodiment. The switch for input signals 30 and the sampling time control switch 22 are composed of N type transistors. The gate of the switch for input signals 30 is connected to the switch for input signals control signal output terminal 54. The gate of the sampling time control switch 22 is connected to the sampling time control signal output terminal 53. The second delay circuit 56 is composed of an even number of inverters connected in series. The first delay circuit 57 includes an even number of inverters connected in series, where the number of inverters is less than the inverters in the second delay circuit 56.

When the timing control signal input terminal 51 switches from High level to Low level, one of the inputs of the AND circuit 171 switches to Low level. Thus the output of the AND circuit 171, which is the dynamic comparator control signal output terminal 52, switches to Low level and the dynamic comparator 70 enters the standby mode (the time of 106 in FIG. 5). Next, when the output of the second delay circuit 56 switches from High level to Low level after a predetermined time, the sampling time control signal output terminal 53 switches to High level by the inverter circuit 174 and the sampling time control switch 22 is made conductive and thereby starting the sampling. Moreover, since both two inputs of the NOR circuit 173 switch to Low level, the switch for input signals control signal output terminal 54 switches to High level, and the switch for input signals 30 is also made conductive (at the time of 102 of FIG. 5).

When the timing control signal input terminal 51 switches from Low level to High level, one input of the NOR circuit 173 switches to High level. Thus the switch for input signals control signal output terminal 54 switches to Low level and the switch for input signals 30 enters a blocking state (at the time 103 of FIG. 5). Next, when the output of the first delay circuit 57 switches High level after a predetermined time, both of the two inputs of the AND circuit 171 switch to High level. Therefore, the dynamic comparator control signal output terminal 52 switches to High level, and the dynamic comparator 70 enters the comparison mode (at the time of 104 of FIG. 5). Next, if the output of the second delay circuit 56 switches to High level after a predetermined time, the sampling time control signal output terminal 53 switches to Low level, and the sampling time control switch 22 enters a blocking state (at the time of 105 of FIG. 5). Since one input of the NOR circuit 173 is set to High level at the time 103 of FIG. 5, the switch for input signals control signal output terminal 54 is not influenced by the output of the second delay circuit 56.

It is noted that the delay circuit of FIG. 9 is composed of a plurality of inverter circuits, however it is not limited to inverter circuits but may be buffer circuits, other logic gate circuits or timing generation circuits as long as the circuit generates delay time.

Fifth Exemplary Embodiment

Figure 10:
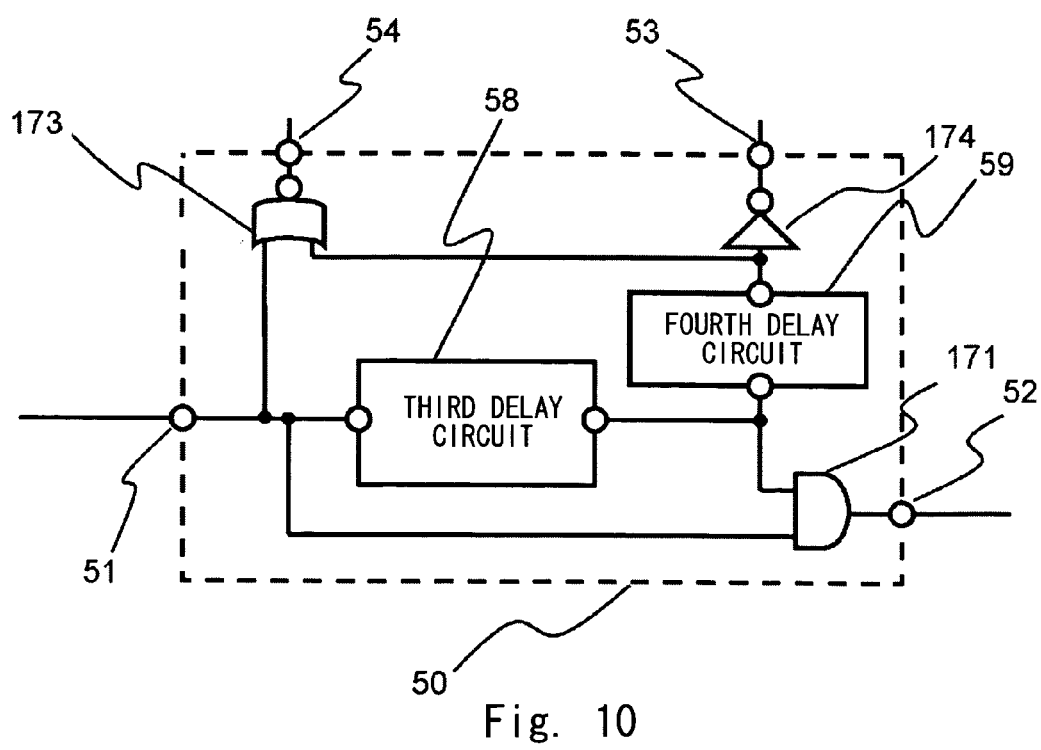
FIG. 10 is a circuit diagram illustrating the configuration of a timing control circuit of a semiconductor integrated circuit according to a fifth exemplary embodiment of the present invention.

A fifth exemplary embodiment is shown in FIG. 10. The timing control circuit 50 is composed of a third delay circuit 58, a fourth delay circuit 59, the NOR circuit 173, the AND circuit 171 and the inverter circuit 174. The timing control signal input terminal 51 is connected to the switch for input signals control signal output terminal 54 via the NOR circuit 173. Moreover, the timing control signal input terminal 51 is connected also to the input of the third delay circuit 58. The output of the third delay circuit 58 is connected to the fourth delay circuit 59 and the input of the AND circuit 171. The output of the AND circuit 171 is connected to the dynamic comparator control signal output terminal 52. The output of the fourth delay circuit 59 is connected to the input of the NOR circuit 173 and the input of the inverter circuit 174. The output of the inverter circuit 174 is connected to the sampling time control signal output terminal 53. The output of the NOR circuit 173 is connected to the switch for input signals control signal output terminal 54. Moreover, one input of the NOR circuit 173 and one input of the AND circuit 171 are connected to the timing control signal input terminal 51.

The fifth exemplary embodiment achieves a new effect that it eliminates the need for the condition on the delay time of the first and the second delay circuits, which is required in the fourth exemplary embodiment. The fifth exemplary embodiment enables to ensure that sampling is terminated after the dynamic comparator 70 starts the comparison mode.

Figure 11:
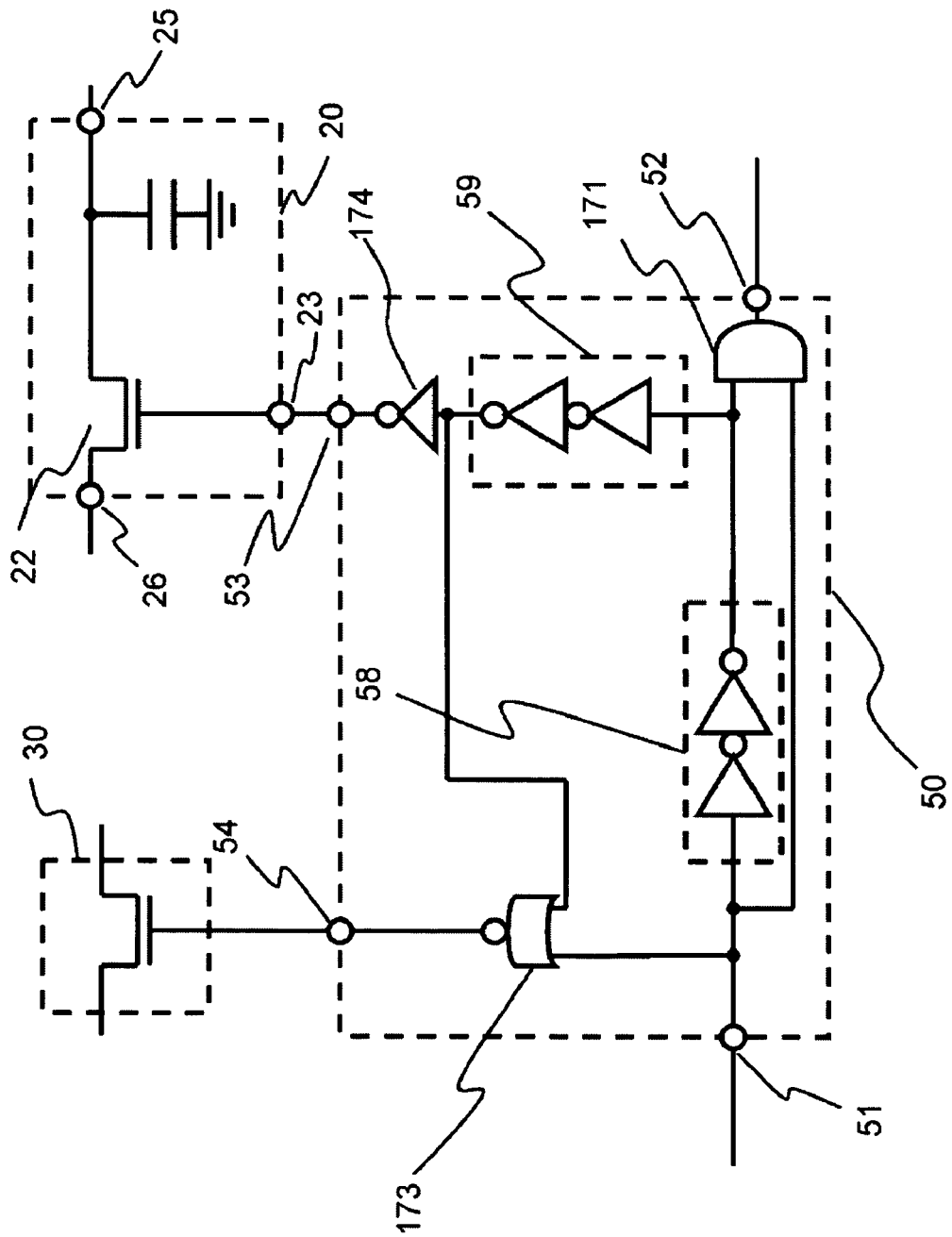
FIG. 11 is a circuit diagram illustrating a part of the configuration of the semiconductor integrated circuit according to the fifth exemplary embodiment of the present invention.

The fifth exemplary embodiment is illustrated in FIG. 11. The switch for input signals 30 and the sampling time control switch 22 are composed of N type transistors. The gate of the switch for input signals 30 is connected to the switch for input signals control signal output terminal 54. The gate of the sampling time control switch 22 is connected to the sampling time control signal output terminal 53. The third delay circuit 58 and the fourth delay circuit 59 are composed of even number of inverters connected in series.

It is noted that the delay circuit of FIG. 11 is composed of a plurality of inverter circuits, however it is not limited to inverter circuits but may be buffer circuits, other logic gate circuits or timing generating circuits as long as the circuit generates delay time.

Sixth Exemplary Embodiment

FIG. 12 shows a sixth exemplary embodiment. The sixth exemplary embodiment provides a circuit configuration in which the circuit configuration of the first exemplary embodiment is expanded by a plurality of the dynamic comparators 70 for comparing a plurality of the reference potentials 3.

In the circuit of FIG. 12, as compared to FIG. 4, several sets of the switch for input signals 30, the capacitor for comparator 40 and the dynamic comparator 70 are connected to the plurality of reference potentials 3. The plurality of switches for input signals 30 are connected between the input signal source 60 and respective input signal input terminals 8 of the dynamic comparator 70. One ends of the plurality of capacitors for comparator 40 are connected between the input terminals for input signals 8 and the switches for input signals 30. The other ends are connected to the fixed potential. The plurality of switches for input signals 30 are connected so that they may operate synchronously by the timing control circuit 50. If the switches for input signals 30 are transistors, each of the gates is connected to the switch for input signals control signal output terminal 54. The mode switching terminals 4 of the dynamic comparators 70 are also connected to the dynamic comparator control signal output terminal 52.

The sixth exemplary embodiment achieves a new effect that it enables to output a comparison result 84 to the plurality of reference potentials at once.

It is noted that FIG. 12 illustrates the case of two dynamic comparators 70. However the circuit can be expanded in a similar way with three or more dynamic comparators.

Seventh Exemplary Embodiment

A seventh exemplary embodiment is shown in FIG. 13. The difference of the seventh exemplary embodiment from the sixth exemplary embodiment is that the switches for input signals 30 are integrated to be one switch. The seventh exemplary embodiment achieves a new effect as compared to the sixth embodiment that the switches for input signals 30 can be one switch.

It is noted that FIG. 13 illustrates the case of two dynamic comparators 70. However the circuit can be expanded in a similar way with three or more dynamic comparators.

Eighth Exemplary Embodiment

Figure 14:
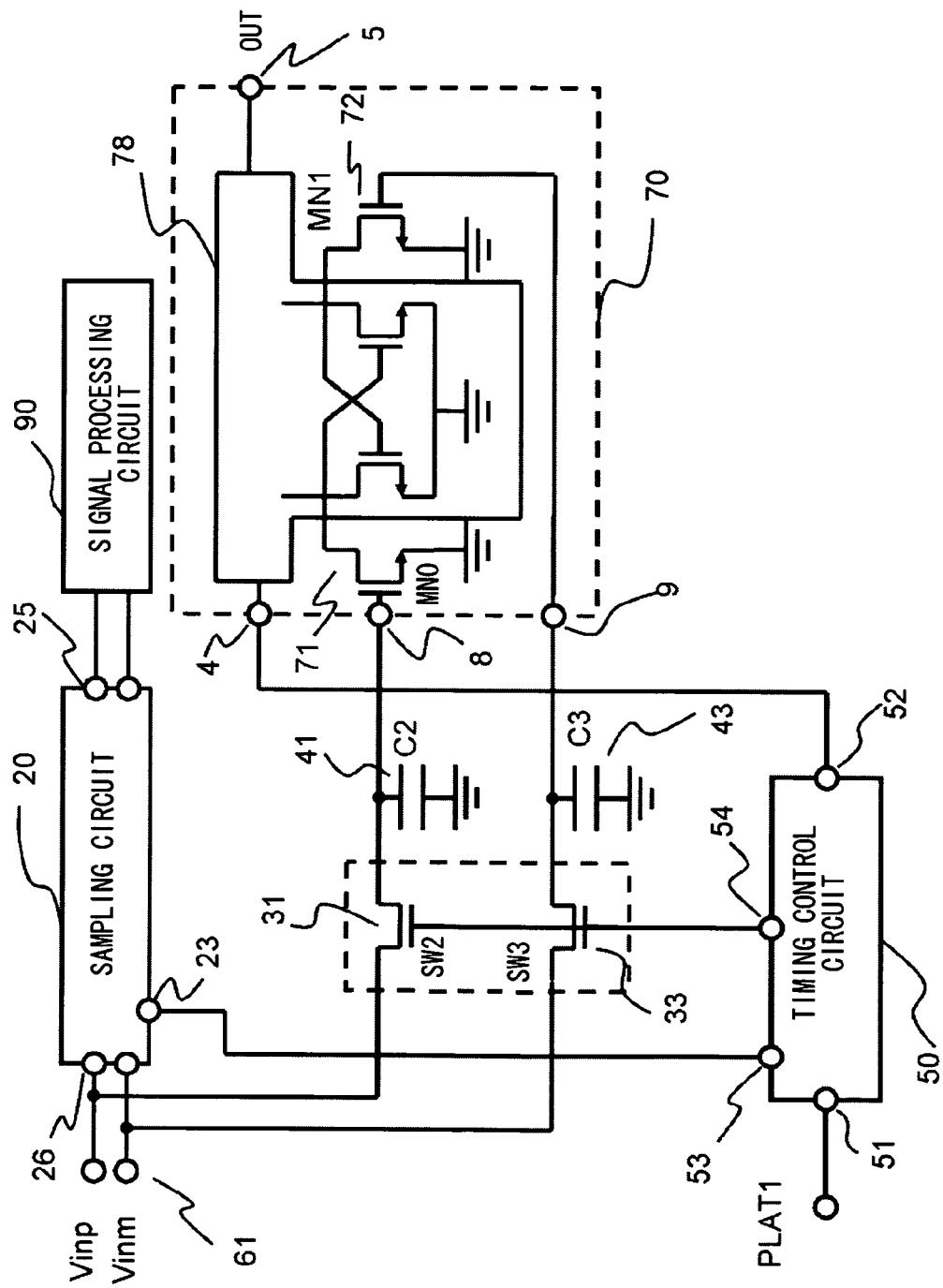
FIG. 14 is a circuit diagram illustrating the configuration of a semiconductor integrated circuit according to a eighth exemplary embodiment of the present invention.

An eighth exemplary embodiment is shown in FIG. 14. The eighth exemplary embodiment provides a circuit configuration in which the input signal source of the first embodiment is replaced from a single input to a differential input. Instead of the connection to the reference potential source 3 in FIG. 6, a connection is made to a minus signal source Vinm to correspond to the two signals, which are a plus and a minus signals, of a differential input signal 61. Also in the sampling circuit 20, the sampling time control switches 22 and the sampling input potential holders 24 (not shown) are provided to each of the two signals. The sampling time control switch 22 for each signal synchronizes in response to a signal of the sampling time control signal input terminal 23 to operate. If the sampling time control switches 22 are transistors, gates are connected to the sampling time control signal input terminal 23.

The eighth exemplary embodiment achieves a new effect that the circuit configuration, which is symmetric to the two signals as with the second exemplary embodiment shown in FIG. 6, enables to suppress the influence of switching noise generated by the switch for input signals 30.

Ninth Exemplary Embodiment

Figure 15:
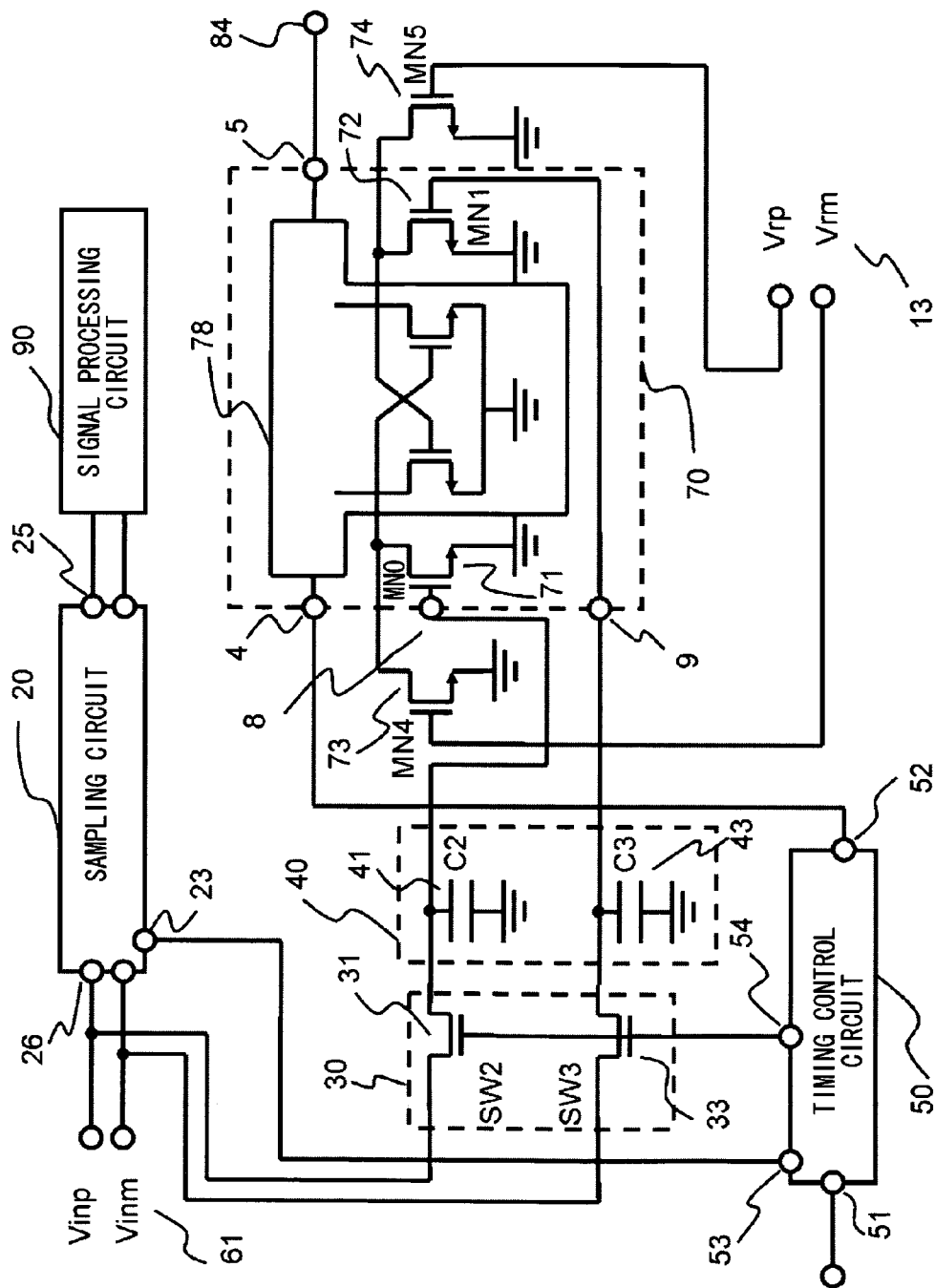
FIG. 15 is a circuit diagram illustrating the configuration of a semiconductor integrated circuit according to a ninth exemplary embodiment of the present invention.

A ninth exemplary embodiment is shown in FIG. 15. The ninth exemplary embodiment provides a circuit configuration in which reference potentials Vrp and Vrm are provided to a plus signal Vinp and a minus signal Vinm of a differential input signal. For the differential input signal, correct signals are not provided in Vinp-Vinm, but correct signals are provided in (Vinp−Vrp)-(Vinm−Vrm), i.e., (Vinp+Vrm)-(Vinm+Vrp). In order to respond this, the ninth exemplary embodiment includes differential input transistors 73 and 74 which receive a differential input reference potential 13 in addition to the circuit of FIG. 14. A gate and a drain of the first differential input transistor 73 are respectively connected to the minus reference potential source Vrm and the drain of the first initial stage input signal transistor 71. Similarly, a gate and a drain of the second differential input transistor 74 are respectively connected to the plus reference potential source Vrp and the drain of the second initial stage input signal transistor 72.

In the ninth exemplary embodiment, the result of the comparison between the plus signal potential Vinp and the minus reference potential Vrm, and the minus signal potential Vinm and the plus reference potential Vrp appears as a potential difference between a drain potential of the first initial stage input signal transistor 71 and a drain potential of the second initial stage input signal transistor 72. The dynamic comparator latch circuit section 78 performs a comparison to the potential difference and outputs the result to the output terminal 5 of the dynamic comparator.

In the ninth exemplary embodiment, the differential input transistors 73 and 74 enable to handle the case when a reference potential signal for a differential input signal is provided, which cannot be handled by the eighth exemplary embodiment.

Tenth Exemplary Embodiment

Figure 16:
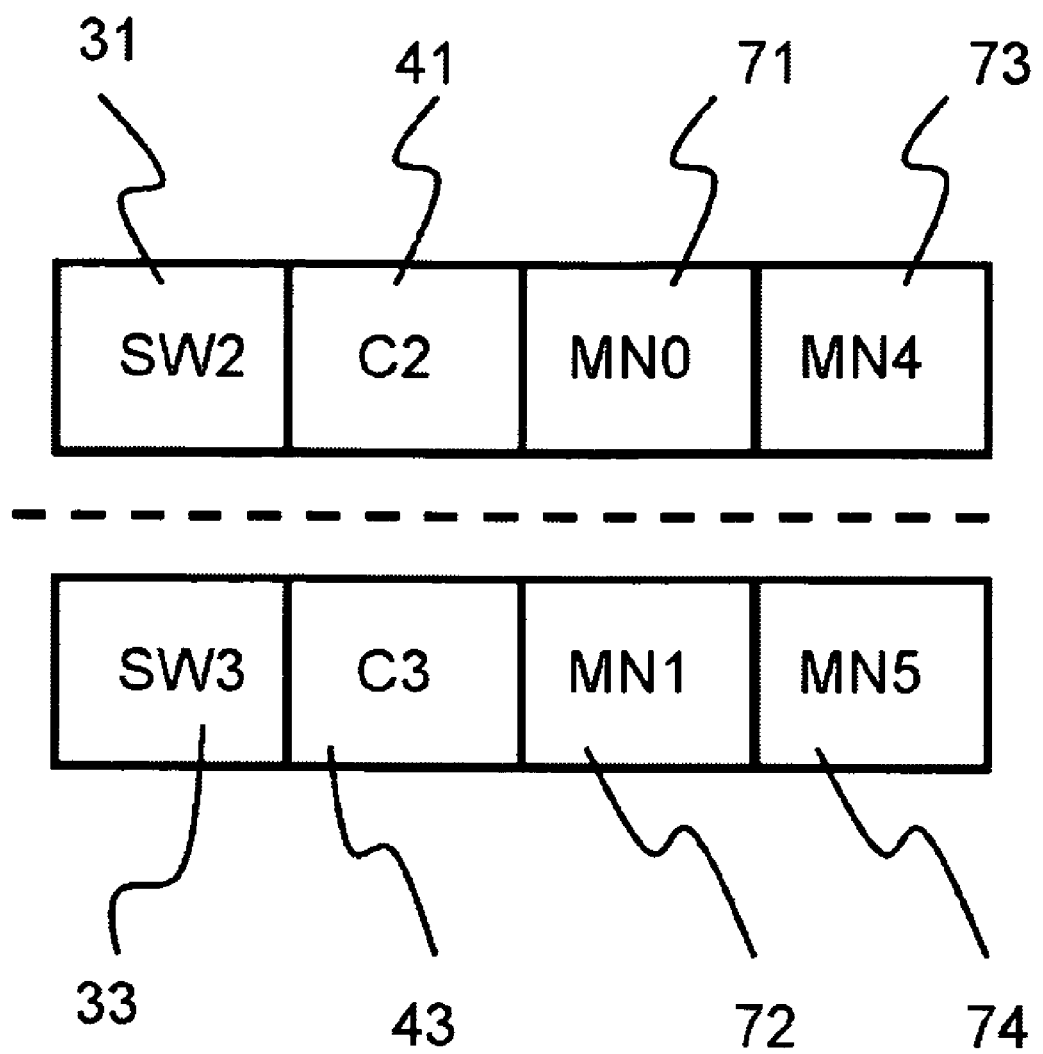
FIG. 16 is a layout diagram illustrating the configuration of a semiconductor integrated circuit according to a tenth exemplary embodiment of the present invention.

A tenth exemplary embodiment is shown in FIG. 16. The tenth exemplary embodiment provides a circuit configuration in which, for the circuit of the ninth exemplary embodiment, the differential input transistors (73 and 74), the initial stage input signal transistors (71 and 72), switches for input signals (31 and 33) and capacitors for comparator (41 and 43) are arranged axisymmetrically over a chip. FIG. 16 is a layout diagram illustrating the axisymmetric arrangement of the above components over a chip. As shown in FIG. 16, each component for the two signals of a differential input is placed axisymmetrically.

In the tenth exemplary embodiment, the switches for input signals (31 and 33), the capacitors for comparator (41 and 43), the initial stage input signal transistors (71 and 72) and differential input transistors (73 and 74) are placed axisymmetrically over a chip for the two signals of the differential input signal. Thus the influence of variations, such as threshold voltage and oxide film thickness, becomes the same, and the influence by the random offset resulting from the variations can be reduced. As a result, a comparator which is strong against the characteristic variation in manufacturing process is obtained as a new effect.

It is noted that in FIG. 16, the switches for input signals (31 and 33), the capacitors for comparator (41 and 43), the initial stage input signal transistors (71 and 72), and the differential input transistors (73 and 74) are arranged in order, however the order maybe different. Apart of the components may not be placed axisymmetrically.

Eleventh Exemplary Embodiment

Figure 17:
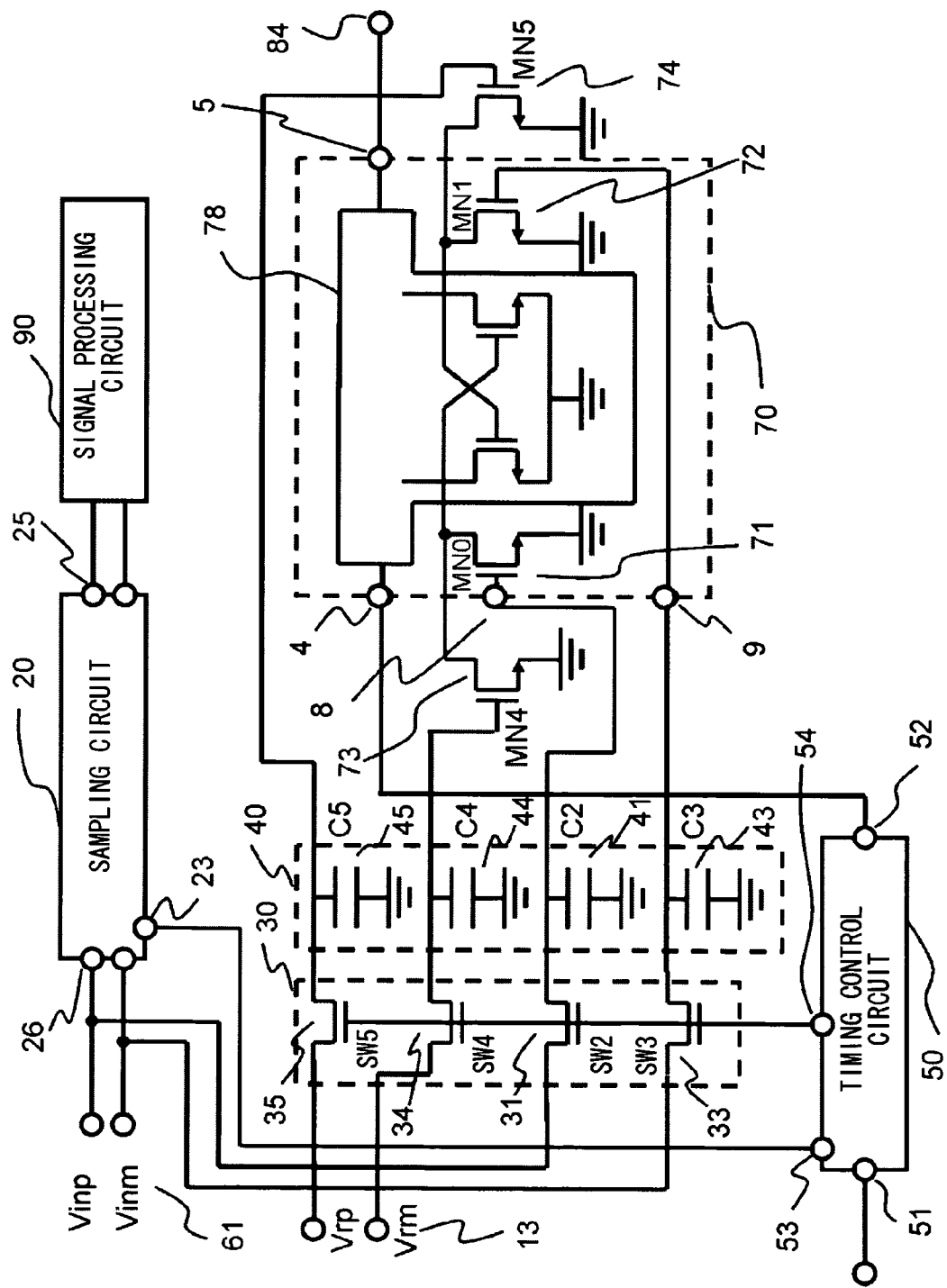
FIG. 17 is a circuit diagram illustrating the configuration of a semiconductor integrated circuit of an eleventh embodiment.

An eleventh exemplary embodiment is shown in FIG. 17. In the eleventh exemplary embodiment, for the tenth exemplary embodiment, the switch for input signals 30 and the capacitor for comparator 40 are connected also to the reference potential 13 of a differential input signal, as with the differential input signal.

In the eleventh exemplary embodiment, the switches for input signals (34 and 35) are connected between the reference potential source 13 and the gates of the differential input transistors (73 and 74). Further, one ends of the capacitors for comparator (44 and 45) are connected between respective switches or input signals (34 and 35) and differential input transistors (73 and 74). The other ends are connected to the fixed potential. Both of the switches for input signals (34 and 35) which are connected to each of signal lines are operated in response to a signal from the switch for input signals control signal output terminal 54.

The eleventh exemplary embodiment achieves a new effect of preventing kickback noise from flowing into the reference potential source for a differential input signal.

Twelfth Exemplary Embodiment

Figure 18:
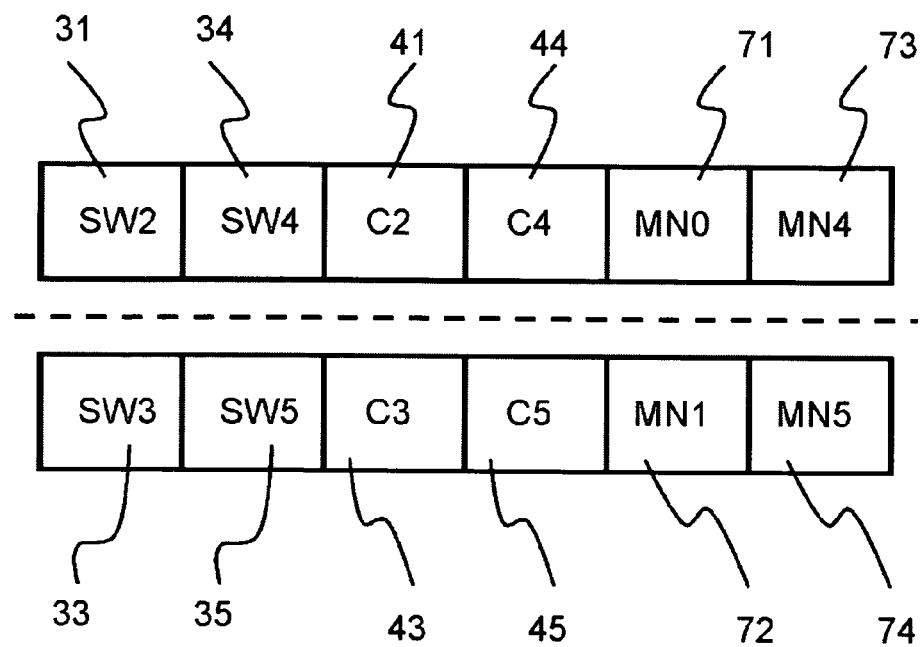
FIG. 18 is a layout diagram illustrating the configuration of a semiconductor integrated circuit according to a twelfth exemplary embodiment of the present invention.

A twelfth exemplary embodiment is shown in FIG. 18. In the twelfth exemplary embodiment, the differential input transistors (73 and 74), the initial stage input signal transistors (71 and 72), the switches for input signals (31, 33, 34 and 35) and capacitors for comparator (41, 43, 44 and 45) are respectively placed axisymmetrically over a chip. FIG. 18 is a layout diagram illustrating the axisymmetric arrangement of the above components over a chip. As shown in FIG. 18, each component for the two signals of the differential input is placed axisymmetrically.

In the twelfth exemplary embodiment, as each component is placed axisymmetrically to the two signals of the differential input signal, the influence of variations in threshold voltage or oxide film thickness becomes the same. Thus the influence by random off set caused by the variation can be reduced. As a result, the twelfth exemplary embodiment achieves an effect that it is strong against characteristics variation in manufacturing process.

Although the input signal source 60 has been used to explain, it is needless to say that an output of other circuit can be used as an input signal source.

The above exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
a sampling circuit which samples a potential of an input terminal;
a dynamic comparator having a standby and a comparison mode which compares the potential of the input terminal and a reference potential, the dynamic comparator comprising an output terminal outputting a comparison result of the comparison of the potential of the input terminal and a reference potential and a mode switching terminal which switches between the standby mode and the comparison mode;
a switch for input signals connected between the input terminal and the dynamic comparator;
a capacitor for comparator having one end connected between the switch for input signals and the dynamic comparator and another end connected to a fixed potential; and
a timing control circuit which controls a timing to sample by the sampling circuit, a timing to switch the modes of the dynamic comparator by applying a signal to the mode switching terminal, and a timing to make the switch for input signals enter a conducting state or a blocking state,
wherein the timing control circuit makes the switch for input signals enter the blocking state from the conducting state before the dynamic comparator switches from the standby mode to the comparison mode, and terminates the sampling by the sampling circuit after the mode switch.

2. The semiconductor integrated circuit according to claim 1, wherein the dynamic comparator is a comparator using a latch circuit which amplifies a minimal potential difference and holds the minimal potential difference.

3. The semiconductor integrated circuit according to claim 2, wherein the sampling circuit comprises:
an input potential holder having a capacitor; and
a switch for sampling which is connected between an input terminal of the sampling circuit and the input potential holder to control start and end of a sampling.

4. A semiconductor integrated circuit comprising:
a sampling circuit which samples a potential of an input terminal;
a dynamic comparator having a standby and a comparison mode which compares the potential of the input terminal and a reference potential;
a switch for input signals connected between the input terminal and the dynamic comparator;
a capacitor for comparator having one end connected between the switch for input signals and the dynamic comparator and another end connected to a fixed potential; and
a timing control circuit which controls a timing to sample by the sampling circuit, a timing to switch the modes of the dynamic comparator, and a timing to make the switch for input signals enter a conducting state or a blocking state,
wherein the timing control circuit makes the switch for input signals enter the blocking state from the conducting state before the dynamic comparator switches from the standby mode to the comparison mode, and terminates the sampling by the sampling circuit after the mode switch,
wherein the dynamic comparator is a comparator using a latch circuit which amplifies a minimal potential difference and holds the minimal potential difference,
wherein the sampling circuit comprises:
an input potential holder having a capacitor; and
a switch for sampling which is connected between an input terminal of the sampling circuit and the input potential holder to control start and end of a sampling,
wherein the timing control circuit comprises:
a first control circuit which makes the switch for input signals enter a blocking state in response to a control signal;
a second control circuit which switches the dynamic comparator from the standby mode to the comparison mode after the switch for input signals enters the blocking state; and a third control circuit which outputs a control signal to the switch for sampling after the switch for input signals entered the blocking state in order to terminate sampling.

5. The semiconductor integrated circuit according to claim 4, wherein the second control circuit has a first delay circuit and the third control circuit has a second delay circuit,
the sampling circuit comprises a sampling control terminal which controls the switch for sampling,
the dynamic comparator comprises a mode switching terminal which switches between the standby mode and the comparison mode,
an output terminal of the first delay circuit is connected to the mode switching terminal and an input terminal of the second delay circuit, and
an output terminal of the second delay circuit is connected to the sampling control terminal.

6. The semiconductor integrated circuit according to claim 5, wherein the first delay circuit comprises a plurality of buffer or inverter circuits, and
the second delay circuit comprises a plurality of buffer or inverter circuits.

7. The semiconductor integrated circuit according to claim 5, further comprising:
a reference potential terminal;
a switch for reference potential which is connected between the reference potential terminal and the dynamic comparator,
a capacitor for reference potential having one end connected between the switch for reference potential and the dynamic comparator and another end connected to a fixed potential,
wherein in response to the control signal from the timing control signal, the switch for reference potential synchronizes with the switch for input signals to control the conducting and the blocking state of the switch for reference potential.

8. The semiconductor integrated circuit according to claim 7, wherein the switch for input signals, the capacitor for comparator and an input initial stage transistor in the dynamic comparator which is connected to the switch for input signals are arranged axisymmetrically over a chip with the switch for reference potential, the capacitor for reference potential and an input initial stage transistor in the dynamic comparator which is connected to the switch for reference potential.

9. The semiconductor integrated circuit according to claim 5, wherein the input signal terminal is a differential input signal terminal,
the dynamic comparator compares one of the input signal terminal as a reference potential with another of the input signal terminal,
the dynamic comparator comprises a set of the sampling circuit, the switch for input signals and the capacitor for comparator for each of two input signals of the differential input terminal,
the differential input signal terminal is connected to the dynamic comparator via the corresponding switches for input signals,
the sampling circuits corresponding to the two input signals of the differential input signal terminal synchronize in response to the control signal from the timing circuit to control sampling time,
the switches for input signals corresponding to the two input signals of the differential input terminal synchronize in response to the control signal from the timing control circuit to be the conducting or the blocking state.

10. The semiconductor integrated circuit according to claim 9, wherein the switch for input signals, the capacitor for comparator and the input initial stage transistor in the dynamic comparator, which correspond to one of the input signals of the differential input signal terminal, are arranged axisymmetrically over a chip with the switch for input signals, the capacitor for comparator and the input initial stage transistor in the dynamic comparator, which correspond to another of the input signals of the differential input signal terminal.

11. The semiconductor integrated circuit according to claim 5, further comprising:
a plurality of sets of the dynamic comparators, the switches for input signals and the capacitors for comparator, and
the plurality of switches for input signals synchronize in response to a control signal from the timing control circuit to be the conducting or the blocking state.

12. The semiconductor integrated circuit according to claim 5, further comprising:
a plurality of sets of the dynamic comparators and the capacitors for comparator,
wherein the switches for input signals are connected to first input terminals of the plurality of dynamic comparators,
a second input terminal of each of the dynamic comparator is connected to one end of each of the capacitors for comparator, and another end of the capacitor for comparator is connected to a fixed potential.

* * * * *